(12) United States Patent
Choi et al.

(10) Patent No.: US 11,907,457 B2
(45) Date of Patent: *Feb. 20, 2024

(54) ELECTRONIC DEVICE

(71) Applicant: Samsung Display Co., LTD., Yongin-si (KR)

(72) Inventors: Wonjun Choi, Seoul (KR); Il-Joo Kim, Hwaseong-si (KR); Deokjung Kim, Busan (KR)

(73) Assignee: Samsung Display Co., Ltd., Yongin-si (KR)

( * ) Notice: Subject to any disclaimer, the term of this patent is extended or adjusted under 35 U.S.C. 154(b) by 1 day.

This patent is subject to a terminal disclaimer.

(21) Appl. No.: 17/994,370

(22) Filed: Nov. 27, 2022

(65) Prior Publication Data

US 2023/0086776 A1  Mar. 23, 2023

Related U.S. Application Data

(63) Continuation of application No. 16/953,866, filed on Nov. 20, 2019, now Pat. No. 11,513,622.

(30) Foreign Application Priority Data

Dec. 4, 2019  (KR) .......................... 10-2019-0159987

(51) Int. Cl.
*G06F 3/041* (2006.01)
*G06F 3/044* (2006.01)
(Continued)

(52) U.S. Cl.
CPC .......... *G06F 3/0412* (2013.01); *G06F 3/0446* (2019.05); *H10K 59/40* (2023.02);
(Continued)

(58) Field of Classification Search
CPC .... G06F 3/044; G06F 3/0412; G06F 3/04166; G06F 3/0446; G06F 3/0416;
(Continued)

(56) References Cited

U.S. PATENT DOCUMENTS 9,329,737 B2 * 5/2016 Lee ........................ G06F 3/0446
9,365,414 B2   6/2016 Bowles et al.
(Continued)

FOREIGN PATENT DOCUMENTS

KR  10-2018-0026597  3/2018
KR  10-2021564      9/2019
(Continued)

OTHER PUBLICATIONS

Non-Final Office Action dated Dec. 22, 2021, in U.S. Appl. No. 16/953,866.
(Continued)

*Primary Examiner* — Olga V Merkoulova
(74) *Attorney, Agent, or Firm* — H.C. Park & Associates, PLC

(57) ABSTRACT

An electronic device including an electronic module, a sensing unit divided into a hole area overlapping the electronic module, an active area surrounding the hole area, and a peripheral area adjacent to the active area. A first sensing electrode and a second sensing electrode are disposed in the active area and insulated from each other. The first sensing electrode includes first main patterns, first neighboring patterns having a smaller area than the first main patterns, and a hole pattern connected to the adjacent first neighboring patterns. The second sensing electrode includes second main patterns, second neighboring patterns adjacent the hole area and having a smaller area than the second main patterns, second connection patterns connected to the second main patterns, and a routing pattern connected to the adjacent (Continued)

second neighboring patterns. The hole pattern is disposed in the hole area, and the routing pattern is disposed in the peripheral area.

17 Claims, 20 Drawing Sheets

(51) Int. Cl.
  *H10K 59/40* (2023.01)
  *H10K 59/12* (2023.01)
  *H10K 77/10* (2023.01)
(52) U.S. Cl.
  CPC .... *G06F 2203/04112* (2013.01); *H10K 59/12* (2023.02); *H10K 77/10* (2023.02)
(58) Field of Classification Search
  CPC ............... G06F 3/04164; G06F 3/0443; G06F 2203/04103; G06F 3/041
  See application file for complete search history.

(56) References Cited

U.S. PATENT DOCUMENTS

| | | | |
|---|---|---|---|
| 9,582,087 B2 | 2/2017 | Kang | |
| 9,947,882 B2* | 4/2018 | Zhang | H10K 50/858 |
| 11,513,622 B2* | 11/2022 | Choi | H10K 59/40 |
| 2008/0067324 A1 | 3/2008 | Heiler et al. | |
| 2008/0277259 A1* | 11/2008 | Chang | G06F 3/0446 |
| | | | 200/600 |
| 2009/0213090 A1* | 8/2009 | Mamba | G06F 3/0446 |
| | | | 345/174 |
| 2010/0216282 A1 | 8/2010 | Wang et al. | |
| 2011/0032209 A1* | 2/2011 | Kim | G06F 3/0446 |
| | | | 445/24 |
| 2011/0135122 A1 | 6/2011 | Awamura et al. | |
| 2011/0248953 A1* | 10/2011 | Lee | G06F 3/0446 |
| | | | 345/174 |
| 2012/0112368 A1 | 5/2012 | Gorai et al. | |
| 2014/0098057 A1* | 4/2014 | Lee | G06F 3/0443 |
| | | | 345/174 |
| 2016/0307971 A1 | 10/2016 | Jeon | |
| 2018/0158741 A1* | 6/2018 | Kim | H01L 22/34 |
| 2018/0224984 A1 | 8/2018 | Kim et al. | |
| 2019/0049483 A1* | 2/2019 | Matsuzawa | B81B 7/0048 |
| 2019/0064960 A1* | 2/2019 | Na | G06F 3/0446 |
| 2019/0131379 A1 | 5/2019 | Won et al. | |
| 2019/0233279 A1* | 8/2019 | Yanagisawa | G01P 1/023 |
| 2020/0034595 A1 | 1/2020 | Jang et al. | |
| 2020/0089369 A1 | 3/2020 | Bang et al. | |
| 2020/0173949 A1 | 6/2020 | Lee et al. | |
| 2020/0175900 A1 | 6/2020 | Han et al. | |
| 2020/0175901 A1 | 6/2020 | Lee et al. | |

FOREIGN PATENT DOCUMENTS

| | | |
|---|---|---|
| KR | 10-2020-0033362 | 3/2020 |
| KR | 10-2020-0065189 | 6/2020 |
| KR | 10-2020-0066415 | 6/2020 |
| KR | 10-2020-0066445 | 6/2020 |

OTHER PUBLICATIONS

Final Office Action dated Apr. 29, 2022, in U.S. Appl. No. 16/953,866.
Notice of Allowance dated Jul. 26, 2022, in U.S. Appl. No. 16/953,866.

* cited by examiner

ELECTRONIC DEVICE

CROSS-REFERENCE TO RELATED APPLICATION

This application is a Continuation of U.S. patent application Ser. No. 16/953,866, filed on Nov. 20, 2020, which claims priority from and the benefit of Korean Patent Application No. 10-2019-0159987, filed on Dec. 4, 2019, each of which is hereby incorporated by reference for all purposes as if fully set forth herein.

BACKGROUND

Field

Exemplary embodiments of the invention relate generally to an electronic device, and more specifically, to an electronic device in which a hole overlapping an electronic module is defined and which detects an external input.

Discussion of the Background

An electronic device is activated by an electrical signal. An electronic device is composed of various electronic components, such as an electronic panel and an electronic module. The electronic panel may include a display unit for displaying an image or a sensing unit for detecting an external input. Electronic components can be electrically interconnected by variously arranged signal lines.

The display unit includes a light emitting element for generating an image. The sensing unit may include sensing electrodes for detecting an external input. The sensing electrodes are disposed in an active area. The sensing unit is designed to provide even sensitivity to the entire active area.

The above information disclosed in this Background section is only for understanding of the background of the inventive concepts, and, therefore, it may contain information that does not constitute prior art.

SUMMARY

Exemplary embodiments of the present disclosure provide an electronic device with improved reliability.

Additional features of the inventive concept will be set forth in the description which follows, and in part will be apparent from the description, or may be learned by practice of the inventive concept.

An exemplary embodiment of the inventive concept provides an electronic device including: an electronic module; and a sensing unit divided into a hole area overlapping the electronic module, an active area surrounding the hole area, and a peripheral area adjacent to the active area and including a first sensing electrode and a second sensing electrode disposed in the active area and insulated from each other, wherein the first sensing electrode includes first main patterns, first neighboring patterns having a smaller area than the first main patterns, and a hole pattern connected to the adjacent first neighboring patterns, wherein the second sensing electrode includes second main patterns, second neighboring patterns adjacent the hole area and having a smaller area than the second main patterns, second connection patterns connected to the second main patterns, and a routing pattern connected to the adjacent second neighboring patterns, wherein the hole pattern is disposed in the hole area, and the routing pattern is disposed in the peripheral area.

The sensing unit may be defined by a first detection insulating layer, a first conductive layer disposed on the first detection insulating layer, a second detection insulating layer covering the first conductive layer and having a plurality of defined first contact holes overlapping the active area, and a second conductive layer disposed on the second detection insulating layer. The second connection patterns are included in the first conductive layer, wherein the first main patterns, the first neighboring patterns, the second main patterns, and the second neighboring patterns may be included in the second conductive layer, wherein the second connection patterns may be connected to the second main patterns through the first contact holes.

The routing pattern may be disposed on the same layer as the first neighboring patterns.

The hole pattern may be disposed on the same layer as the second neighboring patterns.

The routing pattern may extend in the same direction as the direction in which the second neighboring patterns are arranged.

Among the first neighboring patterns, first neighboring patterns disposed between the second neighboring patterns connected with the routing pattern may be spaced apart from the routing pattern on a plane.

Among the second neighboring patterns, second neighboring patterns disposed between the first neighboring patterns connected with the hole pattern may be spaced apart from the hole pattern on a plane.

The electronic device may further include a crack detection circuit including a crack detection line disposed in the peripheral area, a crack detection pattern disposed in the hole area, and a connection line connecting the crack detection line and the crack detection pattern.

The electronic device may further include routing dummy patterns disposed between the crack detection line and the routing pattern, wherein the connection line may cross between the routing dummy patterns.

The electronic device may further include an antistatic pattern disposed in the hole area and disposed between the crack detection pattern and the hole pattern.

The hole pattern may surround at least a portion of the crack detection pattern.

Each of the first sensing electrode and the second sensing electrode may include mesh lines defining mesh opening parts.

The electronic device may include a display unit disposed under the sensing unit and including first electrodes, a second electrode facing the first electrodes, and light emitting layers disposed between the first electrodes and the second electrode, wherein each of the light emitting layers may overlap the corresponding mesh opening parts.

Each of the second main patterns may include a center pattern extending in one direction and branch patterns connected to the center pattern and extending in diagonal directions of the one direction, wherein each of the first main patterns may surround a portion of the center pattern of a corresponding second main pattern among the second main patterns and the branch patterns.

The electronic module may include a first electronic module and a second electronic module, wherein the hole area may include a first hole area overlapping the first electronic module and a second hole area overlapping the second electronic module.

The electronic module may include at least one of an image input module, an image output module, an optical detection module, and an optical output module.

Another exemplary embodiment of the inventive concept provides an electronic device including: a display unit including a plurality of pixels; an electronic module disposed under the display unit; a sensing unit divided into a hole area overlapping the electronic module, an active area surrounding the hole area, and a peripheral area adjacent to the active area and including a first sensing electrode and a second sensing electrode disposed in the active area and insulated from each other; and a module hole defined through at least a portion of the display unit and the sensing unit overlapping the hole area. The first sensing electrode includes a hole pattern connecting first neighboring patterns cut by the module hole, wherein the second sensing electrode includes a routing pattern connecting the second neighboring patterns cut by the module hole, wherein the hole pattern is disposed in the hole area, and the routing pattern is disposed in the peripheral area.

The first sensing electrode may include first main patterns having a larger area than the first neighboring patterns, wherein the second sensing electrode may include second main patterns having a larger area than the second neighboring patterns and second connection patterns connecting the main patterns.

Among the first neighboring patterns, first neighboring patterns disposed between the second neighboring patterns connected with the routing pattern may be spaced apart from the routing pattern on a plane.

Among the second neighboring patterns, second neighboring patterns disposed between the first neighboring patterns connected with the hole pattern may be spaced apart from the hole pattern on a plane.

The electronic device may further include a crack detection circuit including a crack detection line disposed in the peripheral area, a crack detection pattern surrounding the module hole, and a connection line connecting the crack detection line and the crack detection pattern.

The electronic device may further include routing dummy patterns disposed between the crack detection line and the routing pattern, wherein the connection line may cross between the routing dummy patterns.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
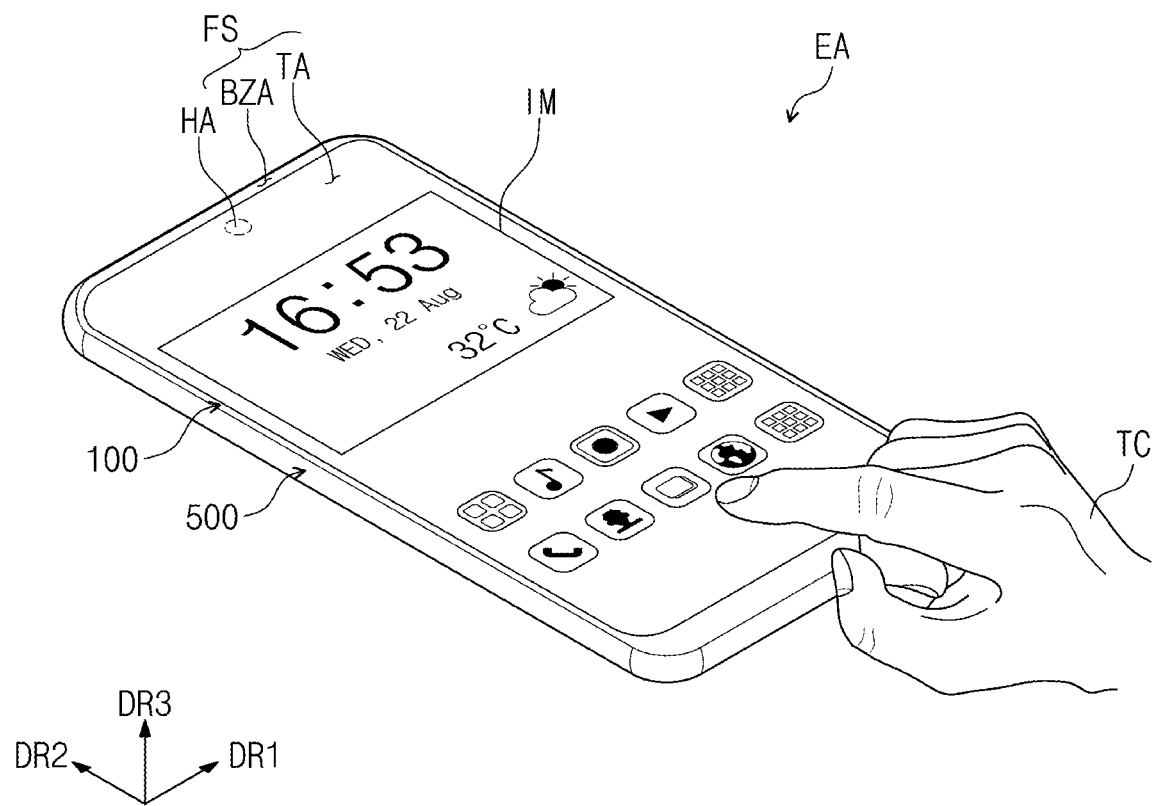
FIG. 1 is an assembled perspective view of an electronic device according to an exemplary embodiment of the inventive concept.

In the following description, for the purposes of explanation, numerous specific details are set forth in order to provide a thorough understanding of various exemplary embodiments of the invention. As used herein "embodiments" are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As customary in the field, some exemplary embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some exemplary embodiments may be physically separated into two or more interacting and discrete blocks, units, and/or modules without departing from the scope of the inventive concepts. Further, the blocks, units, and/or modules of some exemplary embodiments may be physically combined into more complex blocks, units, and/or modules without departing from the scope of the inventive concepts.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2:
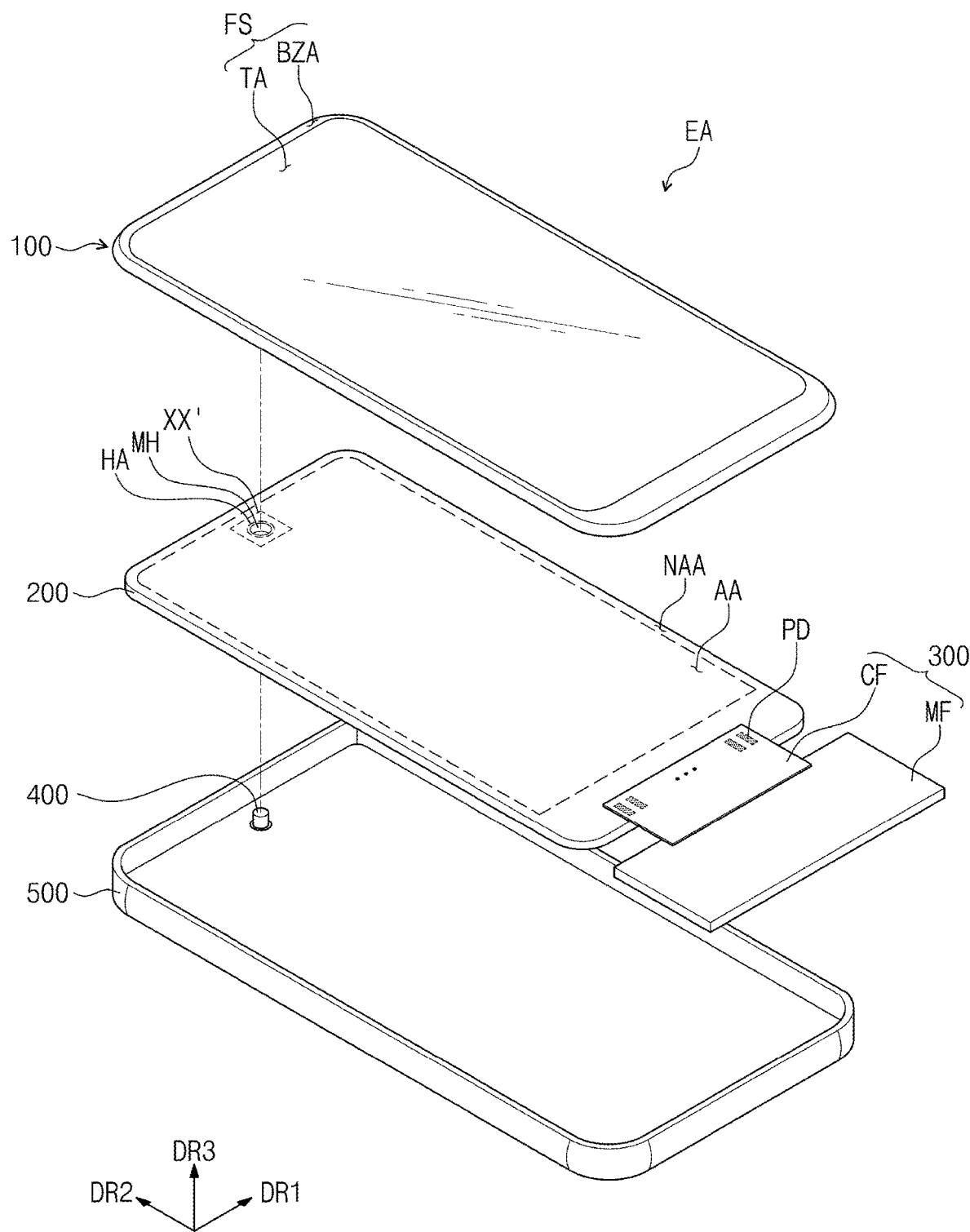
FIG. 2 is an exploded perspective view of an electronic device according to an exemplary embodiment of the inventive concept.
Figure 3:
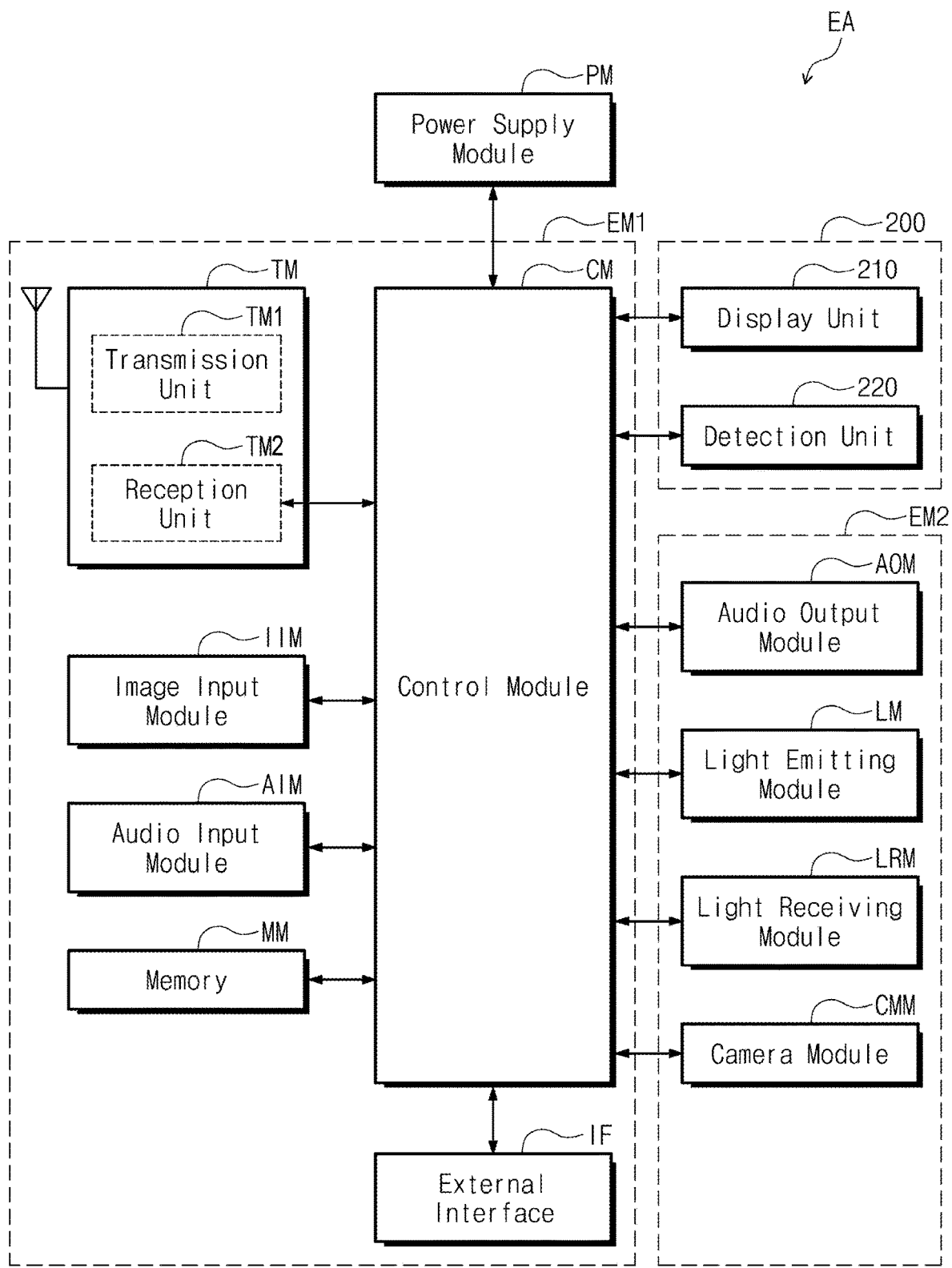
FIG. 3 is a block diagram of an electronic device according to an exemplary embodiment of the inventive concept.

FIG. 1 is an assembled perspective view of an electronic device according to an exemplary embodiment of the inventive concept. FIG. 2 is an exploded perspective view of an electronic device according to an exemplary embodiment of the inventive concept. FIG. 3 is a block diagram of an electronic device according to an exemplary embodiment of the inventive concept.

Referring to FIG. 1, an electronic device EA may be a device that is activated in response to an electrical signal. The electronic device EA may include various embodiments. For example, the electronic device EA may include a tablet, a notebook, a computer, a smart television, and the like. In the exemplary embodiment described in this disclosure, an electronic device EA is illustrated as an example on a smart phone.

The display device EA can display the image IM toward the third direction DR3 on the display surface FS parallel to the first direction DR1 and the second direction DR2. The display surface FS on which the image IM is displayed may correspond to the front surface of the electronic device EA and may correspond to the front surface FS of the window member WM. Hereinafter, the same reference numerals will be used for the display surface and the front surface of the electronic device EA, and the front surface of the window member WM. The image IM may include still images as well as dynamic images. In FIG. 1, a clock and a plurality of icons are shown as an example of the image IM.

In the present exemplary embodiment, the front surface (or upper surface) and the rear surface (or lower surface) of each member are defined with reference to the direction in which the image IM is displayed. The front surface and the rear surface are opposed to each other in the third direction DR3, and the normal direction of each of the front surface and the rear surface may be parallel to the third direction DR3. The separation distance in the third direction DR3 between the front surface and the rear surface may correspond to the thickness in the third direction DR3 of the electronic device EA. Moreover, the directions that the first to third directions DR1, DR2, and DR3 indicate may be converted to other directions as a relative concept. Hereinafter, first to third directions as directions that the respective first to third directions DR1, DR2, and DR3 indicate refer to the same reference numerals.

The electronic device EA according to an exemplary embodiment of the inventive concept can detect a user input TC applied from the outside. The external input may be provided in various forms. For example, the user input TC may include an external input (e.g., hovering) that is applied close to or spaced a predetermined distance from the electronic device EA as well as contact by a portion of the body, such as the user's hand. Further, it may have various forms such as force, pressure, and light, and is not limited to any one embodiment.

In addition, the electronic device EA may detect a user input TC applied to the side surface or the rear surface of the electronic device EA according to the structure of the electronic device EA, but is not limited to any one embodiment.

In the present exemplary embodiment, the electronic device EA may include a predetermined hole area HA. The hole area HA may be an area overlapping a module hole MH passing through the electronic panel 200 described later and may be an area overlapping the electronic module 300. The electronic device EA may receive an external signal required for the electronic module 300 through the hole area HA or may provide a signal output from the electronic module 300 to the outside. According to the inventive concept, because the hole area HA is provided to overlap with the transmission area TA, a separate area provided for providing the hole area HA outside the transmission area TA can be omitted.

Thus, the area of the bezel area BZA can be reduced. A detailed description for this will be provided later.

Referring to FIG. 2, the electronic device EA includes a window 100, an electronic panel 200, an electronic module 300, and a housing unit 400. In this exemplary embodiment, the window 100 and the housing unit 400 are combined to form the appearance of the electronic device EA.

The window 100 may include an insulating panel. For example, the window 100 may be composed of glass, plastic, or a combination thereof.

The front surface FS of the window 100 defines the front surface of the electronic device EA, as described above. The transmission area TA may be an optically transparent area. For example, the transmission area TA may be an area having a visible light transmittance of about 90% or more.

The bezel area BZA may be an area with a lower light transmittance compared to the transmission area TA. The shape of the bezel area BZA is defined by the transmission area TA. The bezel area BZA is adjacent to the transmission area TA and may surround the transmission area TA.

The bezel area BZA may have a predetermined color. The bezel area BZA covers the peripheral area NAA of the electronic panel 200 so as to prevent the peripheral area NAA from being visually recognized from the outside. On the other hand, this is illustrated merely as an example, and the bezel area BZA may be omitted in the window 100 in other exemplary embodiments of the inventive concept.

The electronic panel 200 may display an image IM and detect an user input TC. The electronic panel 200 includes a front surface including an active area AA and a peripheral area NAA. The active area AA may be an area activated according to an electrical signal.

In the present exemplary embodiment, the active area AA is an area where the image IM is displayed, and at the same time, an area where the user input TC is detected. The transmission area TA may at least overlap the active area AA. For example, the transmission area TA overlaps the front surface or at least part of the active area AA. Accordingly, the user can view the image IM through the transmission area TA or provide an user input TC. However, this is illustratively shown, and the area where the image IM is displayed in the active area AA and the area where the user input TC is detected may be separated from each other, such that the inventive concept is not limited to any one embodiment.

The peripheral area NAA may be an area covered by the bezel area BZA. The peripheral area NAA is adjacent to the active area AA. The peripheral area NAA may surround the active area AA. A driving circuit, a driving wiring, and the like for driving the active area AA may be disposed in the peripheral area NAA.

In the peripheral area NAA, various signal lines, pads PD, or electronic elements for providing an electrical signal to the active area AA may be disposed. The peripheral area NAA may be covered by the bezel area BZA and not be visible from the outside.

In the illustrated exemplary embodiment, the electronic panel 200 is assembled in a flat state in which the active area AA and the peripheral area NAA face the window 100. However, the inventive concept is not so limited, and a portion of the peripheral area NAA of the electronic panel 200 may be bent. At this time, a portion of the peripheral area NAA is directed to the rear surface of the electronic device EA, so that the bezel area BZA at the front surface of the electronic device EA can be reduced. Alternatively, the electronic panel 200 may be assembled in a state where a portion of the active area AA is also bent. Alternatively, in the electronic panel 200 according to the inventive concept, the peripheral area NAA may be omitted.

The electronic panel 200 includes a display unit 210 and a sensing unit 220. The display unit 210 may have a configuration for generating an image IM substantially. The image IM generated by the display unit 210 is visually recognized from the outside through the transmission area TA.

The sensing unit 220 detects an user input TC applied from the outside. As described above, the sensing unit 220 can detect an user input TC provided to the window 100.

A predetermined hole area HA may be defined in the electronic panel 200. The hole area HA can have a relatively high transmittance with respect to the same area as compared with the active area AA. The hole area HA is defined at a position overlapping with the electronic module 400 described later on a plane.

At least a portion of the hole area HA may be surrounded by the active area AA. In the present exemplary embodiment, the hole area HA is spaced apart from the peripheral area NAA. It is shown that the hole area HA is defined within the active area AA so that all edges are surrounded by the active area AA.

The electronic panel 200 may include a module hole MH defined in the hole area HA and penetrating the electronic panel 200. The module hole MH may penetrate at least one of the display unit 210 and the sensing unit 220. The edge of the hole area HA may extend along the edge of the module hole MH as being substantially spaced a predetermined distance from the edge of the module hole MH. The shape of the edge of the hole area HA may correspond to the module hole MH.

The circuit board 300 may be connected to the electronic panel 200. The circuit board 300 may include a flexible board CF and a main board MB. The flexible board CF may include an insulating film and conductive wirings mounted on the insulating film. The conductive wirings are connected to the pads PD to electrically connect the circuit board 300 and the electronic panel 200.

In this exemplary embodiment, the flexible board CF may be assembled in a bent state. Accordingly, the main board MB is disposed on the rear surface of the electronic panel 200 so that it can be received stably in the space provided by the outer case 500. Meanwhile, in this exemplary embodiment, the flexible board CF may be omitted, and the main board MB may be directly connected to the electronic panel 200 at this time.

The main board MB may include signal lines and electronic elements not shown. The electronic elements may be connected to the signal lines and electrically connected to the electronic panel 200. The electronic elements generate various electrical signals, for example, a signal for generating the image IM or a signal for detecting an user input TC, or may process detected signals. Meanwhile, according to the inventive concept, a plurality of the main boards MB may be provided to correspond to each of electrical signals for generation and processing.

In an electronic device EA according to an exemplary embodiment of the inventive concept, the driving circuit for providing an electric signal to the active area AA may be directly mounted on the electronic panel 200. At this time, the driving circuit may be mounted in the form of a chip or may be formed together with the pixels PX. At this time, the area of the circuit board 300 may be reduced or omitted. The electronic device EA according to the inventive concept may include various embodiments and is not limited to any one embodiment.

The electronic module 400 is disposed below the window 100. The electronic module 400 may overlap the module hole MH on a plane and overlap the hole area HA. The electronic module 400 may receive an external input transmitted through the hole area HA or provide an output through the hole area HA.

In the electronic module 400, a receiving unit for receiving an external input or an output unit for providing an output may overlap the hole area HA on a plane. Some or all of the electronic module 400 may be received in the hole area HA or the module hole MH. According to the inventive concept, the electronic module 400 is disposed overlapping the active area AA, thereby preventing an increase of the bezel area BZA.

Referring to FIG. 3, an electronic device EA may include an electronic panel 200, a power supply module PM, a first electronic module EM1, and a second electronic module EM2. The electronic panel 200, the power supply module PM, the first electronic module EM1, and the second electronic module EM2 may be electrically connected to each other. The display unit 210 and the sensing unit 220 in the configuration of the electronic panel 200 are illustratively shown in FIG. 2.

The first electronic module EM1 and the second electronic module EM2 include various functional modules for operating the electronic device EA. The first electronic module EM1 may be directly mounted on a motherboard electrically connected to the electronic panel 200 or may be mounted on a separate board and electrically connected to the motherboard through a connector (not shown) or the like.

The first electronic module EM1 may include a control module CM, a wireless communication module TM, an image input module IIM, an audio input module AIM, a memory MM, and an external interface IF. Some of the modules may not be mounted on the motherboard, but may be electrically connected to the motherboard through a flexible circuit board.

The control module CM controls the overall operation of the electronic device EA. The control module CM may be a microprocessor. For example, the control module CM activates or deactivates the electronic panel 200. The control module CM can control other modules such as the image input module IIM or the audio input module AIM based on the touch signal received from the electronic panel 200.

The wireless communication module TM may transmit/receive a wireless signal to/from another terminal using Bluetooth or a Wi-Fi line. The wireless communication module TM may transmit/receive a voice signal using a general communication line. The wireless communication module TM includes a transmission unit TM1 for modulating and transmitting a signal to be transmitted, and a reception unit TM2 for demodulating the received signal.

The image input module IIM processes the image signal and converts it into image data that may be displayed on the electronic panel 200. The audio input module AIM receives an external audio signal by a microphone in a recording mode, a voice recognition mode, etc., and converts it into electrical voice data.

The external interface IF serves as an interface to an external charger, a wired/wireless data port, a card socket (e.g., a memory card, a SIM/UIM card).

The second electronic module EM2 may include an audio output module AOM, a light emitting module LM, a light receiving module LRM, and a camera module CMM. The configurations may be directly mounted on the motherboard, or mounted on a separate substrate and electrically connected to the electronic panel 200 through a connector (not shown), or electrically connected to the first electronic module EM1.

The audio output module AOM converts the audio data received from the wireless communication module TM or the audio data stored in the memory MM and outputs the converted audio data to the outside.

The light emitting module LM generates and outputs light. The light emitting module LM may output infrared rays. For example, the light emitting module LM may include an LED element. For example, the light receiving module LRM may detect infrared rays. The light receiving module LRM may be activated when an infrared ray of a predetermined level or higher is detected. The light receiving module LRM may include a CMOS sensor. After the infrared light generated by the light emitting module LM is outputted, the infrared light is reflected by an external object (e.g., a user finger or a face), and the reflected infrared light may be incident on the light receiving module LRM. The camera module CMM captures an image of the outside.

The electronic module 400 according to an exemplary embodiment of the inventive concept may include at least one of the configurations of the first electronic module EM1 and the second electronic module EM2. For example, the electronic module 400 may include at least one of a camera, a speaker, a light detection sensor, and a thermal detection sensor. The electronic module 400 can detect an external object received through the hole area MH or provide a sound signal, such as voice, to the outside through the hole area HA. The electronic module 400 may include a plurality of configurations, and is not limited to any one embodiment.

Accordingly, the electronic module 400 disposed overlapping with the hole area HA may easily visualize the external object through the hole area HA, and the output signal generated by the electronic module 400 may be easily transmitted to the outside. Although not shown in the drawings, the electronic device EA according to the inventive concept may further include a transparent member disposed between the electronic module 400 and the electronic panel 200. The transparent member may be an optically transparent film so that an external input transmitted through the module hole MH is transmitted to the electronic module 400 through the transparent member. The transparent member may be attached to the rear surface of the display panel 200 or may be disposed between the display panel 200 and the electronic module 400 without a separate adhesive layer. The electronic device EA according to the inventive concept may have various structures and is not limited to any one embodiment.

According to the inventive concept, the electronic module 400 may be assembled to overlap the transmission area TA on a plane. Accordingly, an increase in the bezel area BZA according to the accommodation of the electronic module 400 may be prevented, thereby improving the aesthetics of the electronic device EA.

Figure 4A:
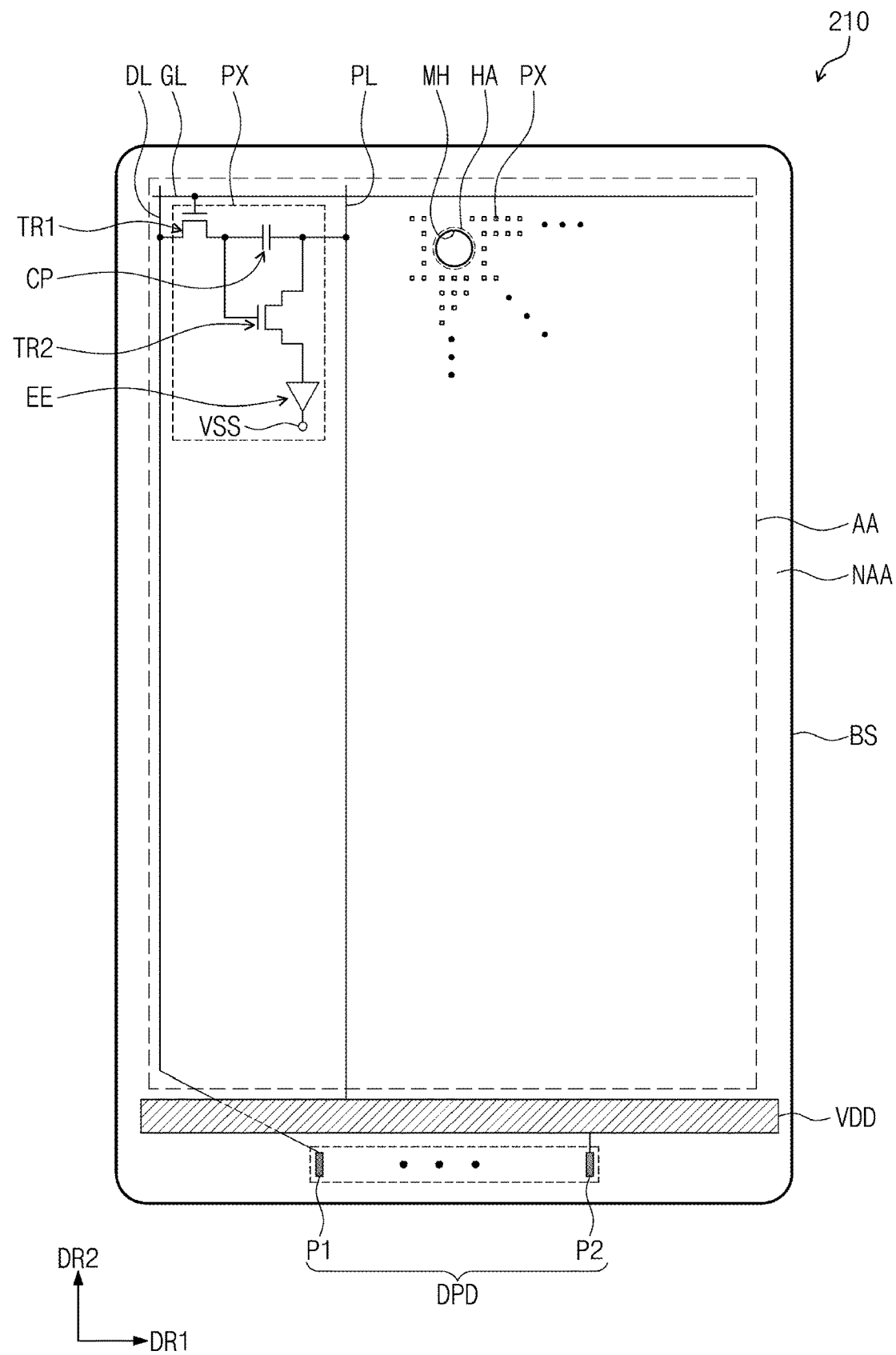
FIG. 4A is a plan view of a display unit according to an exemplary embodiment of the inventive concept.
Figure 4B:
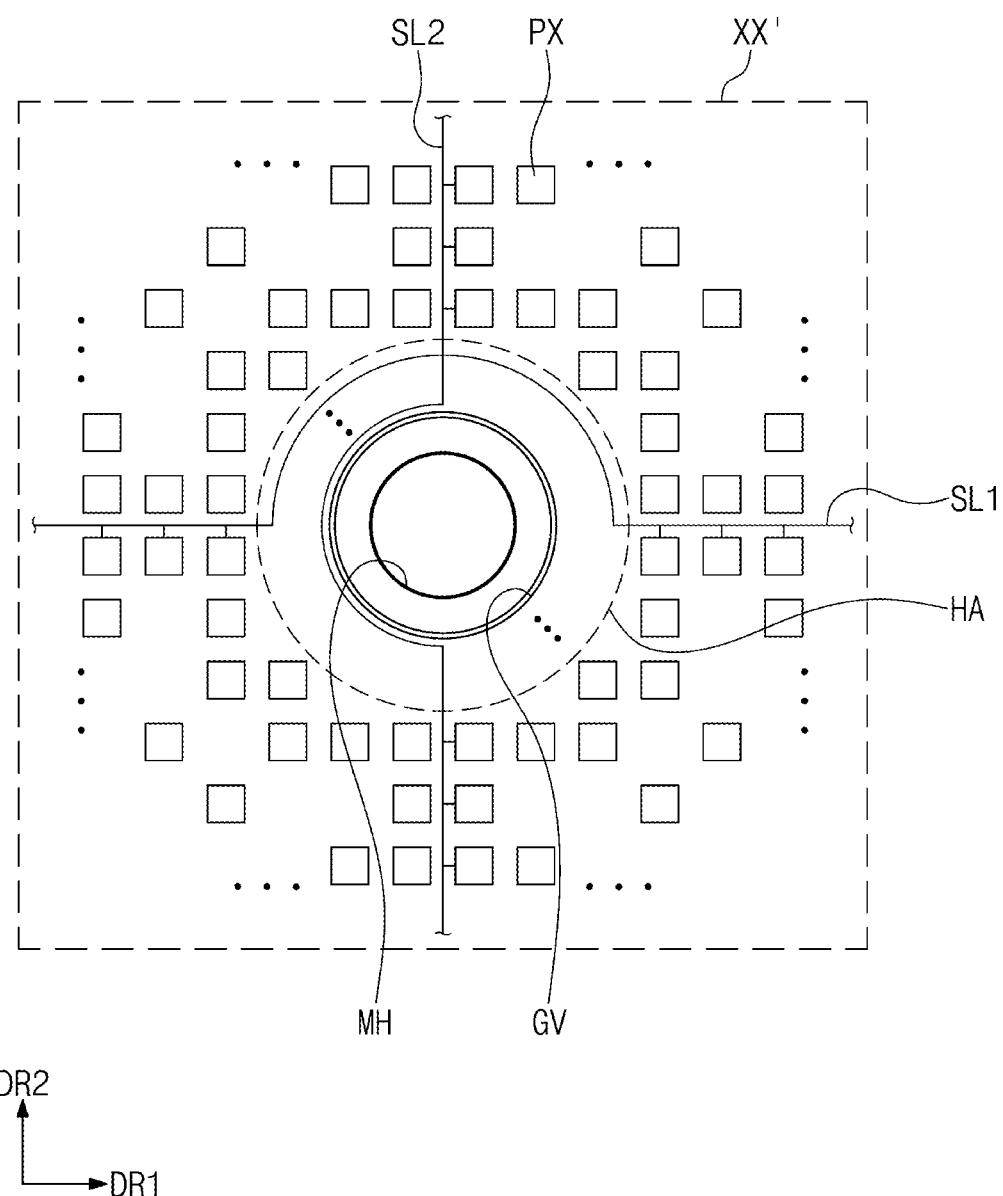
FIG. 4B is an enlarged view of area XX' shown in FIG. 2.
Figure 5A:
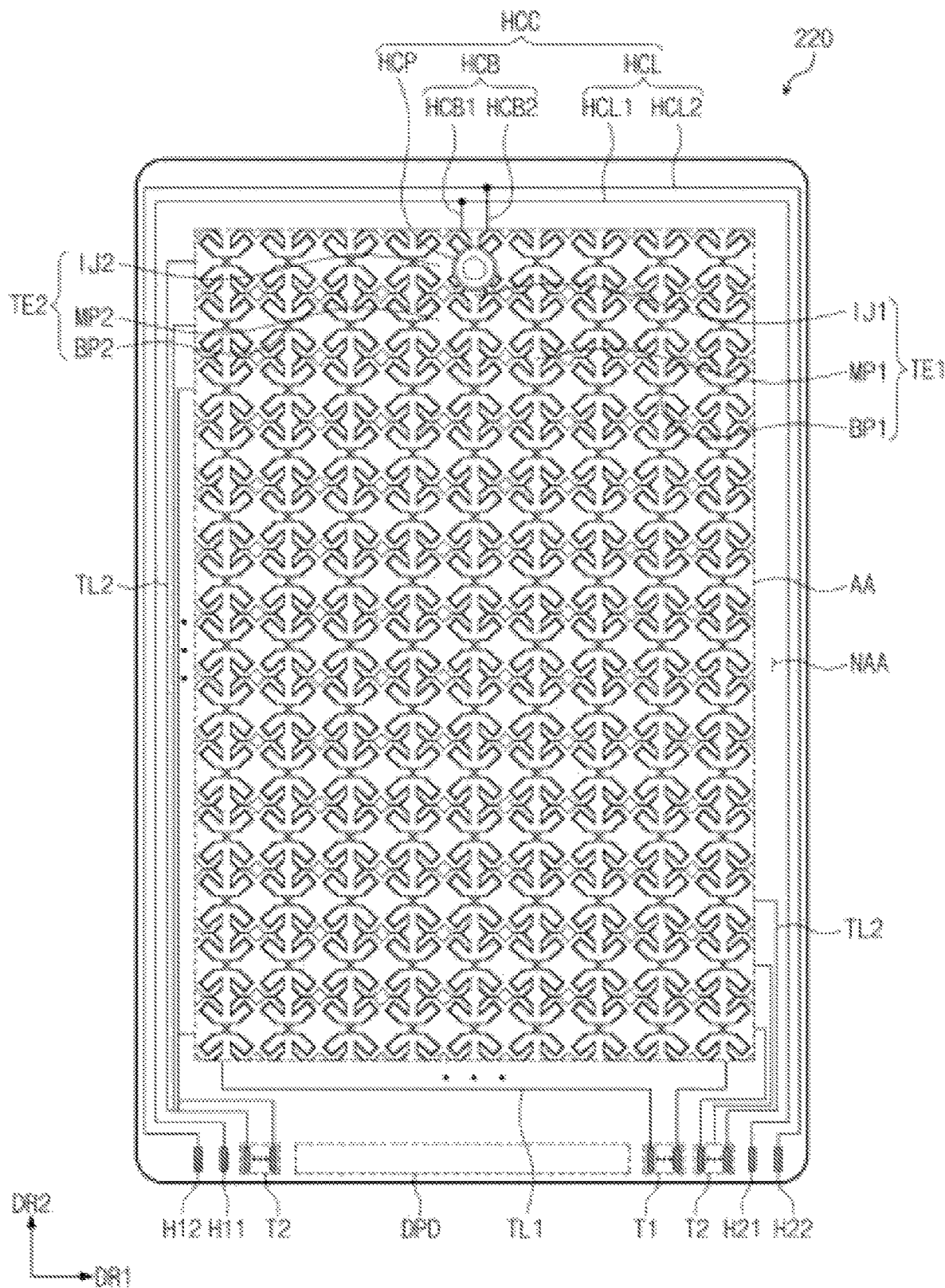
FIG. 5A is a plan view of a sensing unit according to an exemplary embodiment of the inventive concept.
Figure 5B:
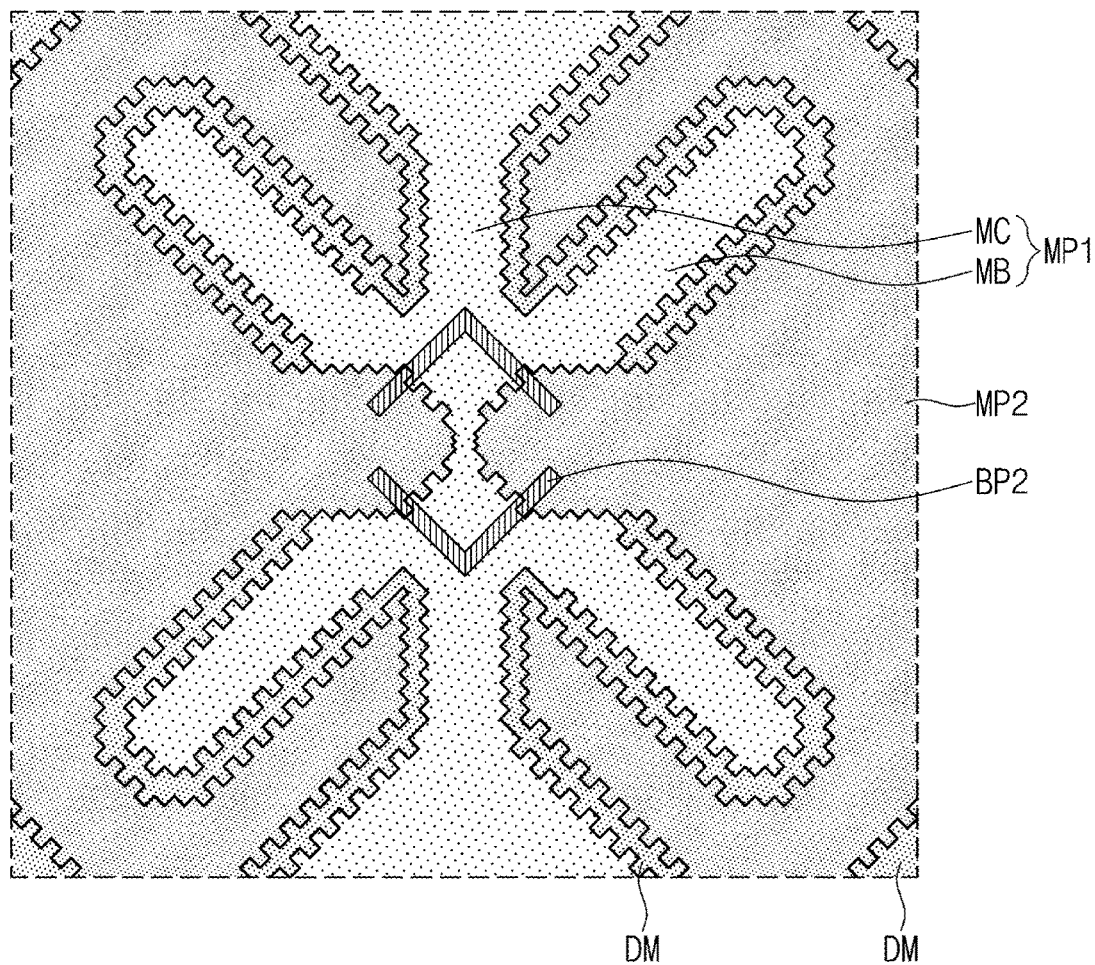
FIG. 5B is an enlarged view of a sensing unit according to an exemplary embodiment of the inventive concept.

FIG. 4A is a plan view of a display unit according to an exemplary embodiment of the inventive concept. FIG. 4B is an enlarged view of area XX' shown in FIG. 2. FIG. 5A is a plan view of a sensing unit according to an exemplary embodiment of the inventive concept. FIG. 5B is an enlarged view of a sensing unit according to an exemplary embodiment of the inventive concept.

FIG. 4A schematically shows a signal circuit diagram, and FIG. 4B shows an enlarged view of area XX' shown in FIG. 2. In FIGS. 4A to 5B, some components are omitted for ease of explanation. Hereinafter, the inventive concept will be described with reference to FIGS. 4A to 5B.

As shown in FIG. 4A, the display unit 210 includes a base substrate BS, a plurality of pixels PX, a plurality of signal lines GL, DL and PL, and a plurality of display pads DPD. The active area AA and the peripheral area NAA may be areas that separate the base substrate BS. The base substrate BS may include an insulating substrate. For example, the base substrate BS may be composed of a glass substrate, a plastic substrate, or a combination thereof.

The signal lines GL, DL and PL are connected to the pixels PX to transmit electrical signals to the pixels PX. A scan line GL, a data line DL, and a power supply line PL among the signal lines are included in the display unit 210. However, this is illustrated by way of example. The signal lines GL, DL, and PL may further include at least one of a power supply line, an initialization voltage line, and a light emission control line, but the inventive concept is not limited to any one embodiment.

The pixel PX may be disposed in the active area AA. In this exemplary embodiment, a signal circuit diagram of one pixel PX among a plurality of pixels is enlarged and shown as an example. The pixel PX may include a first thin film transistor TR1, a capacitor CP, a second thin film transistor TR2, and a light emitting element EE. The first thin film transistor TR1 may be a switching element for controlling ON-OFF of the pixel PX. The first thin film transistor TR1 may transmit or block a data signal transmitted through the data line DL in response to a scan signal transmitted through the scan line GL.

The capacitor CP is connected to the first thin film transistor TR1 and the power supply line PL. The capacitor CP charges the amount of charge corresponding to the difference between the data signal transmitted from the first thin film transistor TR1 and the first power supply signal applied to the power supply line PL.

The second thin film transistor TR2 is connected to the first thin film transistor TR1, the capacitor CP, and the light emitting element EE. The second thin film transistor TR2 controls the driving current flowing to the light emitting element EE in correspondence to the amount of charge stored in the capacitor CP. The turn-on time of the second thin film transistor TR2 may be determined according to the amount of charge charged in the capacitor CAP. The second thin film transistor TR2 provides the first power source signal to the light emitting element EE, which is transmitted through the power supply line PL during the turn-on time.

The light emitting element EE can generate light or control the amount of light according to an electrical signal. For example, the light emitting element EE may include an organic light emitting element, a quantum dot light emitting element, an electrophoretic element, or an electrowetting element.

The light emitting element EE is connected to a power supply terminal VSS and is provided with a power supply signal (hereinafter referred to as a second power supply signal) different from the first power supply signal provided by the power supply line PL. A driving current corresponding to a difference between an electrical signal provided from the second thin film transistor TR2 and a second power supply signal flows through the light emitting element EE and the light emitting element EE generates light corresponding to the driving current.

Meanwhile, the pixel PX may include electronic components having various configurations and arrangements, and is not limited to any one specific embodiment. For example, the pixel PX may have an equivalent circuit including seven transistors and one capacitor.

The pixels PX are disposed around the hole MH and may surround the hole MH on a plane. In FIG. 4B, the hole area HA is shown by dotted lines for ease of explanation. The area XX' includes an area where a hole MH is defined. Hereinafter, the display unit 210 in the area where the holes MH are disposed will be described with reference to FIG. 4B.

As described above, the module holes MH can be defined in the active area AA. Thus, at least some of the pixels PX may be disposed adjacent to the module holes MH. Some of the pixels PX may surround the module holes MH.

On the other hand, a predetermined groove pattern GV can be defined in the hole area HA. The groove pattern GV is disposed along the edge of the module hole MH on a plane, and in this exemplary embodiment, it is shown in a circular ring shape surrounding the module hole MH. However, this is illustrated by way of example. The groove pattern GV may have a different shape from the module hole MH, or have a polygonal, an elliptical, or a closed line shape including at least a part of the curve, or have a shape including a plurality of partially disconnected patterns, and is not limited to any one specific embodiment.

The groove pattern GV corresponds to a depressed portion from the front surface of the display unit 210 and cuts off the path of moisture or oxygen that can be permeated through the module hole MH into the pixel PX. Detailed description for this will be made later.

A plurality of signal lines SL1 and SL2 connected to the pixels PX may be disposed in the hole area HA. The signal lines SL1 and SL2 are connected to the pixels PX through the hole area HA. For ease of description, a first signal line SL1 and a second signal line SL2 among a plurality of signal lines connected to the pixels PX are exemplarily shown in FIG. 4B.

Some of the pixels connected to the first signal line SL1 are arranged on the left side based on the module hole MH and the other part is arranged on the right side based on the module hole MH. Accordingly, even if some pixels in the same row connected to the first signal line SL1 are omitted from the module hole MH, they can be turned on/off by substantially the same gate signal.

The second signal line SL2 extends along the second direction DR2. The second signal line SL2 is connected to the pixels in the same column arranged along the second direction DR2 of the pixels PX. The second signal line SL2 is illustratively described as corresponding to the data line DL.

Some of the pixels connected to the second signal line SL2 are arranged on the upper side based on the module hole MH and the other part is arranged on the lower side based on the module hole MH. Accordingly, even if some pixels around the module hole MH are omitted, the pixels in the same column connected to the second signal line SL2 can receive the data signal through the same line.

The electronic panel 200 according to the inventive concept may further include a connection pattern disposed in the hole area HA. At this time, the first signal line SL1 may be disconnected in an area overlapping the hole area HA. The disconnected portions of the first signal line SL1 may be connected through a connection pattern. Similarly, the second signal line SL2 may be disconnected in the area overlapping the hole area HA, and a connection pattern connecting the disconnected portions of the second signal line SL2 may be further provided.

Again, referring to FIG. 4A, the power supply pattern VDD is disposed in the peripheral area NAA. In this exemplary embodiment, the power supply pattern VDD is connected to a plurality of power supply lines PL. Thus, the display unit 210 includes the power pattern VDD, thereby providing the same first power signal to the plurality of pixels.

The display pads DPD may include a first pad P1 and a second pad P2. The plurality of first pads P1 may be connected to the data lines DL, respectively. The second pad P2 may be connected to the power supply pattern VDD and electrically connected to the power supply line PL. The display unit 210 may provide electrical signals to the pixels PX externally provided through the display pads DPD. The display pads DPD may further include pads for receiving electrical signals other than the first pads P1 and the second pads P2 and are not limited to any specific embodiment.

Referring to FIG. 5A, the sensing unit 220 according to the inventive concept can detect the user input TC (see FIG. 1) and obtain the position and intensity information of the user input TC. The sensing unit 220 includes a plurality of first sensing electrodes TE1, a plurality of second sensing electrodes TE2, a plurality of lines TL1 and TL2, and a plurality of detection pads T1 and T2.

The first sensing electrodes TE1 and the second sensing electrodes TE2 are disposed in the active area AA. The sensing unit 220 can obtain information on the user input TC through a change in capacitance between the first sensing electrodes TE1 and the second sensing electrodes TE2.

The first sensing electrodes TE1 are arranged along the first direction DR1 and each of them extends along the second direction DR2. Each of the first sensing electrodes TE1 may include a first detection pattern SP1 and a first connection pattern BP1. A plurality of the first main patterns MP1 may be provided in plurality.

The first main pattern MP1 is disposed in the active area AA. The first main pattern MP1 may be spaced apart from the module hole MH compared to the first neighboring pattern IJ1.

At least a portion of the first neighboring pattern IJ1 is disposed in the hole area HA. The first neighboring pattern IJ1 has an area smaller than that of the first main pattern MP1. For example, in the process of processing the module hole MH in the hole area HA overlapping with the electronic module 400 in the electronic panel 200, the first neighboring pattern IJ1 may be formed by removing a part of the first main pattern MP1.

The second sensing electrodes TE2 are arranged along the second direction DR2 and each of them extends along the first direction DR1. Each of the second sensing electrodes TE2 may include a second main pattern MP2, a second neighboring pattern IJ2, and a second connection pattern BP2. A plurality of the second main patterns MP2 and the second connection patterns BP2 may be provided.

The second main pattern MP2 is disposed in the active area AA. The second main pattern MP2 may be spaced apart from the module hole MH compared to the second neighboring pattern IJ2. The second main pattern MP2 may be shaped to surround the first main pattern MP1. The second main pattern MP2 may be spaced apart from the first main pattern MP1.

In the present exemplary embodiment, a separation between the first main pattern MP1 and the second main pattern MP2 may be a separation on a cross-section. The first main pattern MP1 and the second main pattern MP2 are not in contact with each other and can transmit and receive independent electrical signals.

At least a portion of the second neighboring pattern IJ2 is disposed in the hole area HA. The second neighboring pattern IJ2 has an area smaller than that of the second main pattern MP2. For example, in the process of processing the module hole MH in the hole area HA overlapping with the electronic module 400 in the electronic panel 200, the second neighboring pattern IJ2 may be formed by removing a part of the second main pattern MP2.

The second connection pattern BP2 extends along the first direction DR1. The second connection pattern BP2 is connected to the second main pattern MP2. The second connection pattern BP2 may be disposed between the two second main patterns to connect the two second main patterns. Alternatively, the second connection pattern BP2 is disposed between the second main pattern MP2 and the second neighboring pattern IJ2 to connect the second main pattern MP2 and the second neighboring pattern IJ2.

FIG. 5B exemplarily illustrates patterns of one unit for detecting the user input TC (see FIG. 1) among the patterns included in the sensing electrodes TE1 and TE2.

According to the inventive concept, the first main pattern MP1 may include a center pattern MC and branch patterns MB.

The first center pattern MC may extend in the second direction DR2. The branch patterns MB may extend from the center pattern MC in the fourth direction DR4 and the fifth direction DR5.

The second main pattern MP2 may surround part of the center pattern MC and the branch patterns MB. However, the second main pattern MP2 may be insulated from the first main pattern MP 1.

The second connection pattern BP2 may overlap a portion of the center pattern MC. Accordingly, the second connection pattern BP2 may be disposed on a layer different from the center pattern MC to avoid electrical interference with the center pattern MC, and the second connection pattern BP2 may be connected through contact holes defined in an insulating layer disposed between the second connection pattern BP2 and the second main pattern MP2.

The sensing unit 220 according to the inventive concept may further include dummy patterns DM disposed between the sensing electrodes TE1 and TE2 spaced apart from each other. The dummy patterns DM may have a floating pattern structure electrically insulated from the sensing electrodes TE1 and TE2. The dummy patterns DM may be disposed between the second main pattern MP2 and the center pattern MC and between the second main pattern MP2 and the branch patterns MB. However, the inventive concept is not limited thereto. The dummy patterns DM may be disposed in at least one of the inside of the first main pattern MP1 and the inside of the second main pattern MP2. The shape and the number of the dummy patterns DM are not limited.

Referring again to FIG. 5A, the detection lines TL1 and TL2 are disposed in the peripheral area NAA. The detection lines TL1 and TL2 may include first detection lines TL1 and second detection lines TL2.

The first detection lines TL1 are connected to the first sensing electrodes TE1, respectively. In the present embodiment, the first detection lines TL1 are respectively connected to lower ends of both ends of the first sensing electrodes TEL However, the inventive concept is not limited thereto and may be connected to both ends of the first sensing electrodes TE1 of the first detection lines TL1.

The second detection lines TL2 are connected to one of one end and the other end of the second sensing electrodes TE2. In the present exemplary embodiment, some of the second detection lines TL2 may be connected to left ends of both ends of the second sensing electrodes TE2, and some of the remaining of the second detection lines TL2 may be connected to the right ends of both ends.

The detection pads T1 and T2 are disposed in the peripheral area NAA. The detection pads T1 and T2 may include first detection pads T1 and second detection pads T2. The first detection pads T1 are respectively connected to the first detection lines TL1 to provide an external signal to the first sensing electrodes TE1. The second detection pads T2 are respectively connected to the second detection lines TL2 to provide an external signal to the second sensing electrodes TE2.

The electronic device EA according to the inventive concept may further include a crack detection circuit HCC. The crack detection circuit HCC receives an electrical signal independent from the first sensing electrodes TE1 and the second sensing electrodes TE2. The crack detection circuit HCC may include a crack detection pattern HCP, a crack detection line HCL, and a connection line HCB connected to each other.

The crack detection pattern HCP may be disposed in the hole area HA. In the present T1 and T2 embodiment, the crack detection pattern HCP may be shaped to surround the edge of the module hole MH. The crack detection pattern HCP includes a conductive material.

The crack detection line HCL is disposed in the peripheral area NAA. In this exemplary embodiment, the crack detection line HCL may be disposed outside the first detection lines TL1 and the second detection lines TL2.

The crack detection line HCL is electrically connected to the crack detection pattern HCP. The crack detection line HCL may include a first line HCL1 and a second line HCL2 spaced apart from each other.

One end of the first line HCL1 is connected to the first pad H11, and one end of the second line HCL2 is connected to the second pad H12. The first pad H11 and the second pad H12 may be disposed at the left side with respect to the area where the display pads DPD are disposed.

The other end of the first line HCL1 is connected to the third pad H21 and the other end of the second line HCL2 is connected to the fourth pad H22. The third pad H21 and the fourth pad H22 may be disposed on the right side with respect to the area where the display pads DPD are disposed. The first pad H11 and the second pad H112 may be spaced apart from the third pad H21 and the fourth pad H22 with the display pads DPD therebetween.

According to the inventive concept, it is possible to determine whether damage such as a crack occurs in the hole area HA or the peripheral area NAA through the crack detection circuit HCC. In the crack detection circuit HCC, the first pad H11 and the third pad H21 may be input terminals, and the second pad H12 and fourth pad H22 may be output terminals.

The electrical signal received through the first pad H11 may pass through the crack detection pattern HCP through the first line HCL1. Thereafter, the electrical signal outputted from the crack detection pattern HCP is outputted to the second pad H12 through the second line HCL2.

Similarly, the electrical signal received through the third pad H21 may pass through the crack detection pattern HCP through the second line HCL2. Thereafter, the electrical signal outputted from the crack detection pattern HCP is outputted to the fourth pad H22 through the second line HCL2.

For example, when a signal detected by each of the second pad H12 and the fourth pad H22 is detected as a defect such as a lower level than the reference signal or a zero level value, it is highly probable that both the first and second lines HCL1 and HCL2 are damaged or the crack detection pattern HCP is damaged. Thus, it is possible to determine whether cracks occur in the hole area HA.

Alternatively, when only a signal detected by one of the second pad H12 and the fourth pad H22 is not detected as a defect, it is likely that the crack detection line HCL is damaged. Through this, it is possible to determine whether a crack occurs in the peripheral area NAA. However, this is merely an example, and the first pad H11 and the third pad H21 may be output terminals, and the second pad H12 and the fourth pad H22 may function as input terminals. The connection line HCB includes a first connection line HCB1 and a second connection line HCB2. The first connection line HCB1 connects the first line HCL1 to one end of the crack detection pattern HCP. The second connection line HCB2 connects the second line HCL2 to the other end of the crack detection pattern HCP.

In the inventive concept, among the connection lines HCB, the connection line HCB disposed in the peripheral area NAA and the connection line HCB disposed in the active area AA may have different shapes. For example, the connection line HCB disposed in the peripheral area NAA may have the same shape as the crack detection line HCL, and the connection line HCB disposed in the peripheral area NAA may have the same shape as the dummy patterns DM (refer to FIG. 5B) floating from the sensing electrodes TE1 and TE2.

According to the inventive concept, by further including a crack detection circuit HCC, it is possible to easily detect whether a failure occurs in the sensing unit 220, in particular, the hole area HA. Accordingly, the reliability of the electronic device is improved, and whether the electronic device is defective can be determined without a separate test circuit or a test device, thereby increasing process efficiency.

Figure 6:
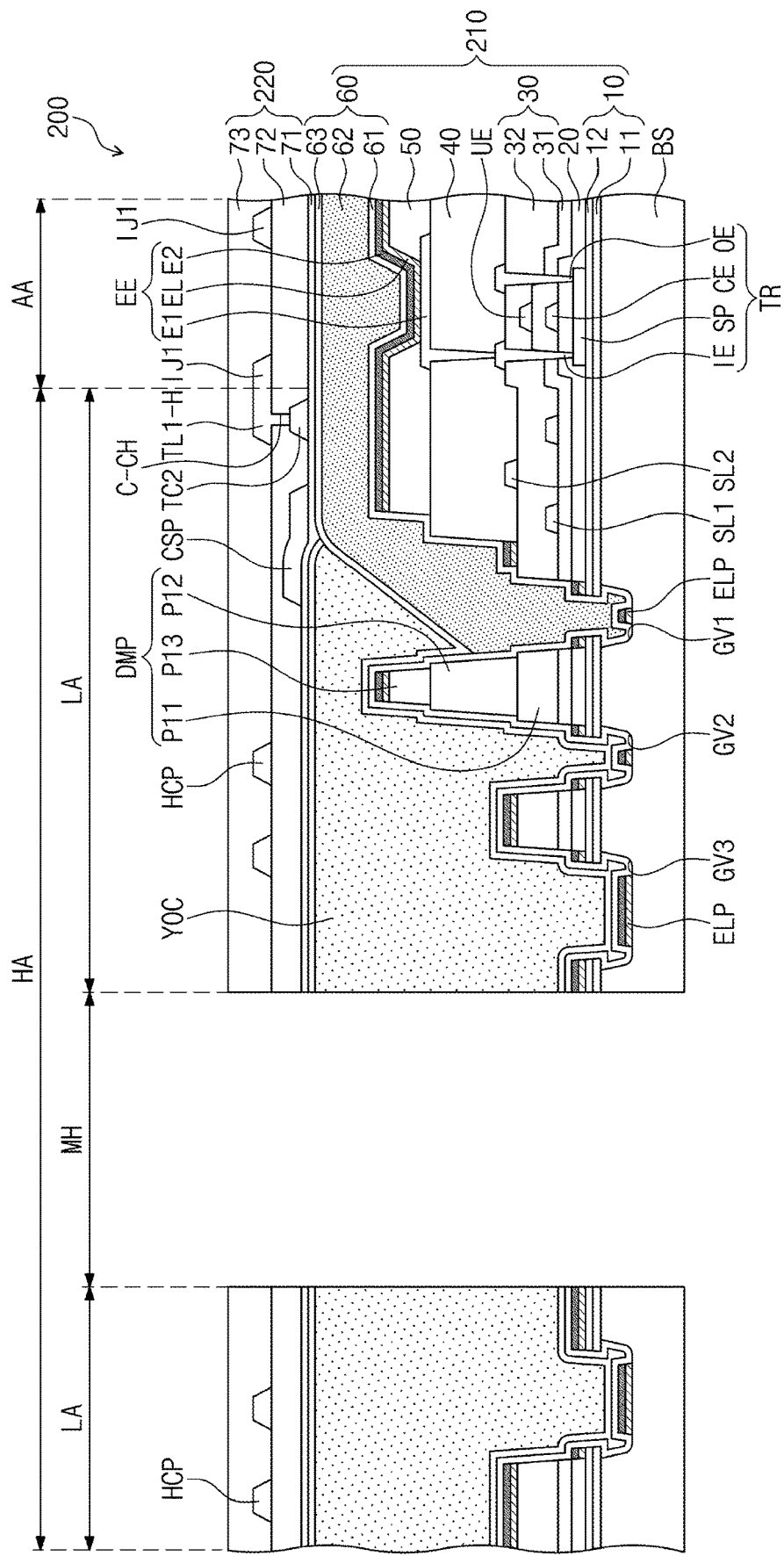
FIG. 6 is a cross-sectional view illustrating a partial area of an electronic panel according to an exemplary embodiment of the inventive concept.

FIG. 6 is a cross-sectional view of a portion of an electronic panel according to an exemplary embodiment of the inventive concept. Moreover, the same components as those described with reference to FIGS. 1 to 5B are given by the same reference numerals and redundant description will be omitted.

As shown in FIG. 6, in the electronic panel 200, the display unit 210 and the sensing unit 220 may be stacked along the third direction DR3. The display unit 210 includes a base substrate BS, a pixel PX, a plurality of insulating layers 10, 20, 30, 40, and 50, and a sealing layer 60.

The base substrate BS may be an insulating substrate. For example, the base substrate BS may include a plastic substrate or a glass substrate.

In this exemplary embodiment, among the configurations of the equivalent circuit diagram of the pixel PX shown in FIG. 4A, a thin film transistor TR corresponding to the second thin film transistor TR2 and a light emitting element EE are exemplarily illustrated.

The insulating layers 10, 20, 30, 40, and 50 may include first to fifth insulating layers 10, 20, 30, 40, and 50 sequentially stacked. Meanwhile, each of the first to fourth insulating layers 10, 20, 30, and 40 may include an organic material and/or an inorganic material, and may have a single layer or laminated structure.

The first insulating layer 10 is disposed on the base substrate BS to cover the front surface of the base substrate BS. The first insulating layer 10 may include a barrier layer 11 and/or a buffer layer 12. Accordingly, the first insulating layer 10 may prevent oxygen or moisture flowing through the base substrate BS from penetrating the pixel, or reduce the surface energy of the base substrate BS so that the pixels are stably formed on the base substrate BS. However, this is merely an example. In the electronic panel 200 according to the inventive concept, at least one of the barrier layer 11 and the buffer layer 12 may be omitted, and a plurality of layers may have a stacked structure and are not limited to any one specific embodiment.

The thin film transistor TR is disposed on the first insulating layer 10. The thin film transistor TR includes a semiconductor pattern SP, a control electrode CE, an input electrode IE, and an output electrode OE. The semiconductor pattern SP is disposed on the first insulating layer 10. The semiconductor pattern SP may include a semiconductor material. The control electrode CE is spaced apart from the semiconductor pattern SP with the second insulating layer 20 therebetween. The control electrode CE may be connected to one electrode of the first thin film transistor TR1 (see FIG. 4A) and the capacitor CP (see FIG. 4A).

The input electrode IE and the output electrode OE are disposed on the third insulating layer 30 and spaced apart from each other on the plane. The input electrode IE and the output electrode OE penetrate the second insulating layer 20 and the third insulating layer 30 and are connected to one side and the other side of the semiconductor pattern SP, respectively.

The display unit 210 according to the inventive concept may further include an upper electrode UE. In the present exemplary embodiment, the third insulating layer 30 includes a lower layer 31 and an upper layer 32. However, this is merely an example, and the third insulating layer 30 according to the inventive concept may have a single layer structure, and is not limited to any one specific embodiment.

The upper electrode UE is disposed between the lower layer 31 and the upper layer 32. The upper electrode UE may overlap the control electrode CE on a plane. In the present exemplary embodiment, the upper electrode UE may receive the same electrical signal as the control electrode CE or receive a different electrical signal than the control electrode CE to serve as one electrode of the capacitor. On the other hand, this is illustratively shown, and in the electronic panel 200 according to the inventive concept, the upper electrode UE may be omitted and is not limited to any one specific embodiment.

The fourth insulating layer 40 is disposed on the third insulating layer 30 to cover the input electrode IE and the output electrode OE. On the other hand, in the thin film transistor TR, the semiconductor pattern SP may be disposed on the control electrode CE. Alternatively, the semiconductor pattern SP may be disposed on the input electrode IE and the output electrode OE. Alternatively, the input electrode IE and the output electrode OE may be disposed on the same layer as the semiconductor pattern SP and directly connected to the semiconductor pattern SP. The thin film transistor TR according to the inventive concept may be formed in various structures, and is not limited to any one specific embodiment.

The light emitting element EE is disposed on the fourth insulating layer 40. The light emitting element EE includes a first electrode E1, a light emitting layer EL, and a second electrode E2. A plurality of the first electrodes E1 and the light emitting layers EL may be provided, and the second electrode E2 may be provided in a cylindrical pattern shape on the entire surface of the active area AA.

The first electrode E1 may be connected to the thin film transistor TR through the fourth insulating layer 40. Moreover, although not shown in the drawing, the electronic panel 200 may further include a separate connection electrode disposed between the first electrode E1 and the thin film transistor TR, and at this time, the first electrode E1 can be electrically connected to the thin film transistor TR through the connection electrode.

The fifth insulating layer 50 is disposed on the fourth insulating layer 40. The fifth insulating layer 50 may include an organic material and/or an inorganic material, and may have a single layer or a laminated structure. An opening part may be defined in the fifth insulating layer 50. The opening part exposes at least a portion of the first electrode E1. The fifth insulating layer 50 may be a pixel defining layer.

The light emitting layer EL is disposed between the first electrode E1 and the second electrode E2. The light emitting layer EL may include at least one light emitting layer. For example, the light emitting layer EL may include at least one of materials emitting red, green, or blue light, and may include a fluorescent material or a phosphorescent material. The light emitting layer EL may include an organic light emitting material or an inorganic light emitting material. The light emitting layer EL may emit light in response to a potential difference between the first electrode E1 and the second electrode E2.

In the present exemplary embodiment, the light emitting layer EL is illustrated as a layer having an integral shape overlapping the plurality of opening parts. However, this is merely an example. The light emitting layer EL may be provided in a plurality of patterns corresponding to each opening part, and is not limited to any one specific embodiment.

The light emitting layer EL may further include a charge control layer in addition to the light emitting layer. The charge control layer controls the movement of the charge to improve the luminous efficiency and lifetime of the light emitting element EE. At this time, the light emitting layer EL may include at least one of a hole transporting material, a hole injecting material, an electron transporting material, and an electron injecting material.

The second electrode E2 is disposed on the light emitting layer EL. The second electrode E2 may be opposed to the first electrode E1. The second electrode E2 may have an integral shape extending from the active area AA to the peripheral area NAA. The second electrode E2 may be provided commonly to a plurality of pixels. The light emitting element EE disposed in each of the pixels receives a common power voltage (hereinafter, referred to as a second power voltage) through the second electrode E2.

The second electrode E2 may include a transmissive conductive material or a semi-transparent conductive material. Accordingly, light generated in the light emitting layer EL can be easily emitted toward the third direction DR3 through the second electrode E2. However, this is merely an example. Depending on the design, the light emitting element EE according to the inventive concept may be driven in the rear surface light-emission system in which the first electrode E1 includes a transparent or semi-transparent material, or may be driven in a double-sided light-emission system in which light is emitted towards both front and rear surfaces, but is not limited to any one specific embodiment.

The sealing layer 60 is disposed on the light emitting element EE to seal the light emitting element EE. Meanwhile, although not shown in the drawing, a capping layer covering the second electrode E2 may be further disposed between the second electrode E2 and the sealing layer 60.

The sealing layer 60 may include a first inorganic layer 61, an organic layer 62, and a second inorganic layer 63 that are sequentially stacked along a third direction DR3. However, the inventive concept is not limited thereto, and the sealing layer 60 may further include a plurality of inorganic layers and organic layers.

The first inorganic layer 61 may cover the second electrode E2. The first inorganic layer 61 can prevent external moisture or oxygen from penetrating the light emitting element EE. For example, the first inorganic layer 61 may include silicon nitride, silicon oxide, or a combination thereof. The first inorganic layer 61 may be formed through a chemical vapor deposition process.

The organic layer 62 can be disposed on the first inorganic layer 61 and contact the first inorganic layer 61. The organic layer 62 can provide a flat surface on the first inorganic layer 61. The curve formed on the upper surface of the first inorganic layer 61 and the particles existing on the first inorganic layer 61 are covered by the organic layer 62, such that this can prevent the influence of the surface state of the upper surface of the first inorganic layer 61 on the structures formed on the organic layer 62. Further, the organic layer 62 can relieve the stress between the contacting layers. The organic layer 62 may include an organic material, and may be formed through a solution process such as a spin coating process, a slit coating process, or an ink jet process.

The second inorganic layer 63 is disposed on the organic layer 62 to cover the organic layer 62. The second inorganic layer 63 can be stably formed on a relatively flat surface as compared to being disposed on the first inorganic layer 61. The second inorganic layer 63 seals moisture or the like emitted from the organic layer 62 to prevent it from being introduced into the outside. The second inorganic layer 63 may include silicon nitride, silicon oxide, or a combination thereof. The second inorganic layer 63 may be formed through a chemical vapor deposition process.

According to the present exemplary embodiment, the hole area HA may include a module hole MH and a wiring area LA. The wiring area LA may be an area between the module hole MH and the active area AA. The wiring area LA may surround the module hole MH on a plane. The light emitting element EE or the thin film transistor TR disposed in the active area AA may be omitted in the wiring area LA. Accordingly, the transmittance may be relatively higher than that of the active area AA.

In the wiring area LA, groove patterns GV1, GV2 and GV3, a dam part DMP, and signal lines SL1 and SL2 of the display unit 210 may be disposed.

The groove patterns GV1, GV2, and GV3 may be defined spaced apart from each other. The groove patterns GV1, GV2, and GV3 may include first to third groove patterns GV1, GV2, and GV3 sequentially formed in the direction from the active area AA to the module hole MH. Each of the first to third groove patterns GV1, GV2 and GV3 has a closed-line shape surrounding the module hole MH or has an intermittent line shape surrounding at least a part of the edge of the module hole MH and is not limited to any one embodiment.

Each of the groove patterns GV1, GV2, and GV3 may be defined by recessing a portion along the third direction DR3, which is a thickness direction of the base substrate BS. That is, each of the groove patterns GV1, GV2, and GV3 may be formed by removing at least a portion of the base substrate BS. The deposition pattern ELP may be disposed in each of the groove patterns GV1, GV2, and GV3, and may be covered by at least one of the first inorganic layer 61 and the second inorganic layer 63. The deposition pattern ELP may include the same material as the material included in the light emitting layer EP.

The electronic panel 200 according to the inventive concept further includes the groove patterns GV1, GV2, and GV3, thereby blocking the continuity between the deposition pattern ELP and the light emitting element EE. Thus, it is possible to prevent damage to elements disposed in the active area AA by cutting off the infiltration path of external moisture or oxygen.

Also, the deposition pattern ELP disposed in each of the groove patterns GV1, GV2 and GV3 is covered by the first inorganic layer 61 or the second inorganic layer 63, so that it is possible to prevent the deposition pattern ELP from being transferred to other elements and affecting them during the manufacturing process of the electronic panel 200 Thus, the process reliability of the electronic panel 200 can be improved. On the other hand, this is merely illustratively shown, and in the electronic panel 200 according to the inventive concept, the groove patterns GV1, GV2, and GV3 may be provided singly or omitted, and are not limited to any one specific embodiment.

The dam part DMP is disposed in the wiring area LA to divide the formation area of the organic layer 62 into a predetermined area and prevents further expansion. A plurality of the dam parts DMP may be provided and disposed between the groove patterns GV1, GV2, and GV3. The dam part DMP is shown as a laminated structure including the first to third layers P11, P12, and P13. However, this is illustratively shown, and the dam part DMP may have a single-layer structure and is not limited to any one specific embodiment.

The electronic panel 200 according to the inventive concept may further include a planarization layer YOC. The planarization layer YOC includes organic matter. The planarization layer YOC is disposed in the hole area HA. The planarization layer YOC covers a non-flat surface defined by the dam part DMP or the groove patterns GV1, GV2, and GV3 to provide a flat surface on the upper part. Accordingly, the flat surface may be stably provided even in an area where the organic layer 62 is not disposed in the hole area HA.

The sensing unit 220 according to the inventive concept may be defined by a plurality of conductive layers and a plurality of detection insulating layers 71, 72, and 73.

The first detection insulating layer 71 covers the planarization layer OC. In the present embodiment, the first detection insulating layer 71 may cover the upper surface of the planarization layer OC in the hole area HA and the upper surface of the second inorganic layer 63 in the active area AA.

The first conductive layer is disposed on the first detection insulating layer 71. In the inventive concept, the first conductive layer may include the second connection pattern BP2 described above with reference to FIG. 5B. In addition, an antistatic pattern CSP and a portion TC2 of a hole pattern to be described later may be included.

The second detection insulating layer 72 is disposed on the first detection insulating layer 71 to cover the first conductive layer.

The second conductive layer is disposed on the second detection insulating layer 72. In the inventive concept, the second conductive layer may include the first sensing electrode TE1 described above with reference to FIG. 5A, the second sensing electrode TE2 except for the second connection pattern BP2, and the dummy patterns DM. In addition, it may include a crack detection pattern HCP and the remaining portions TL1-H of the hole pattern.

The third detection insulating layer 73 is disposed on the second detection insulating layer 72 to cover the second conductive layer. The third detection insulating layer 73 may have an integral shape overlapping the hole area HA and the active area AA.

Each of the first to third detection insulating layers 71, 72, and 73 may include an inorganic layer and/or an organic layer. In this exemplary embodiment, each of the first to third detection insulating layers 71, 72, and 73 is illustrated as a single layer, but may have a laminated structure including a plurality of layers in contact with each other and is not limited to any one specific embodiment.

The patterns included in the crack detection pattern HCP and the second conductive layer may be simultaneously formed through one mask, thereby simplifying the process and reducing the process cost. However, this is merely an example, and a part of the crack detection pattern HCP may be disposed on the first conductive layer, and is not limited to any one specific embodiment.

Figure 7A:
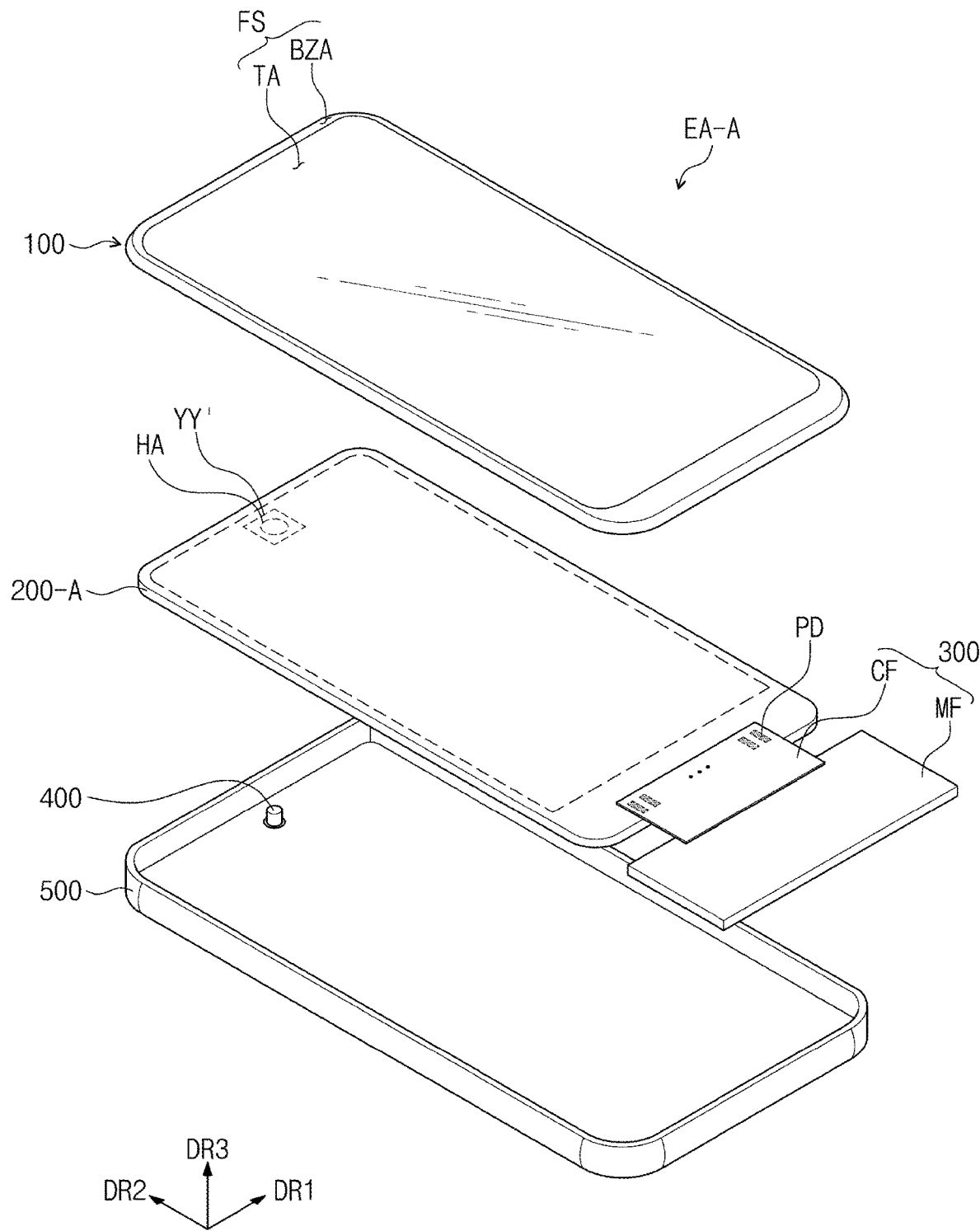
FIG. 7A is a plan view of an electronic device according to an exemplary embodiment of the inventive concept.
Figure 7B:
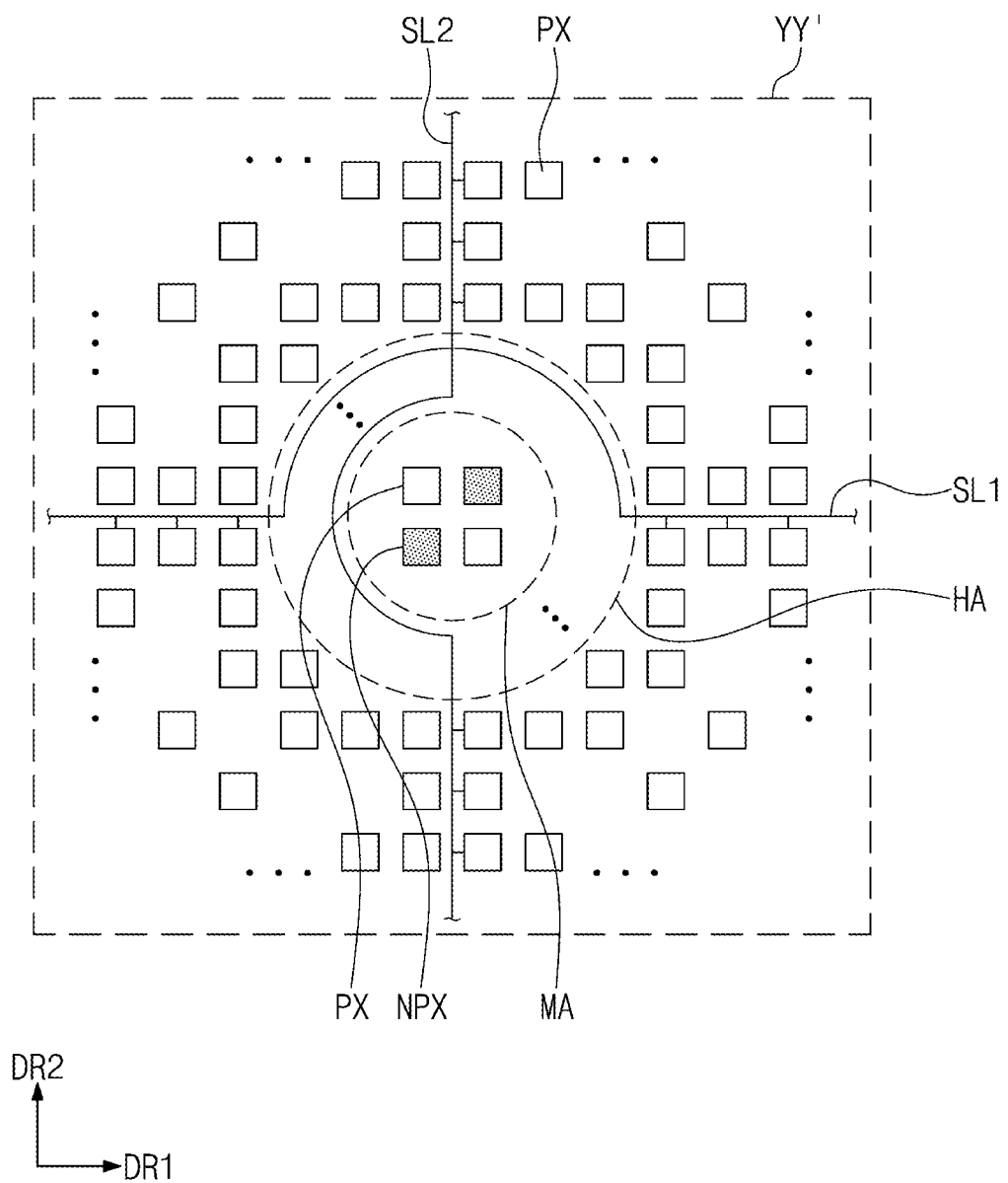
FIG. 7B is an enlarged view of area YY' shown in FIG. 7A.
Figure 7C:
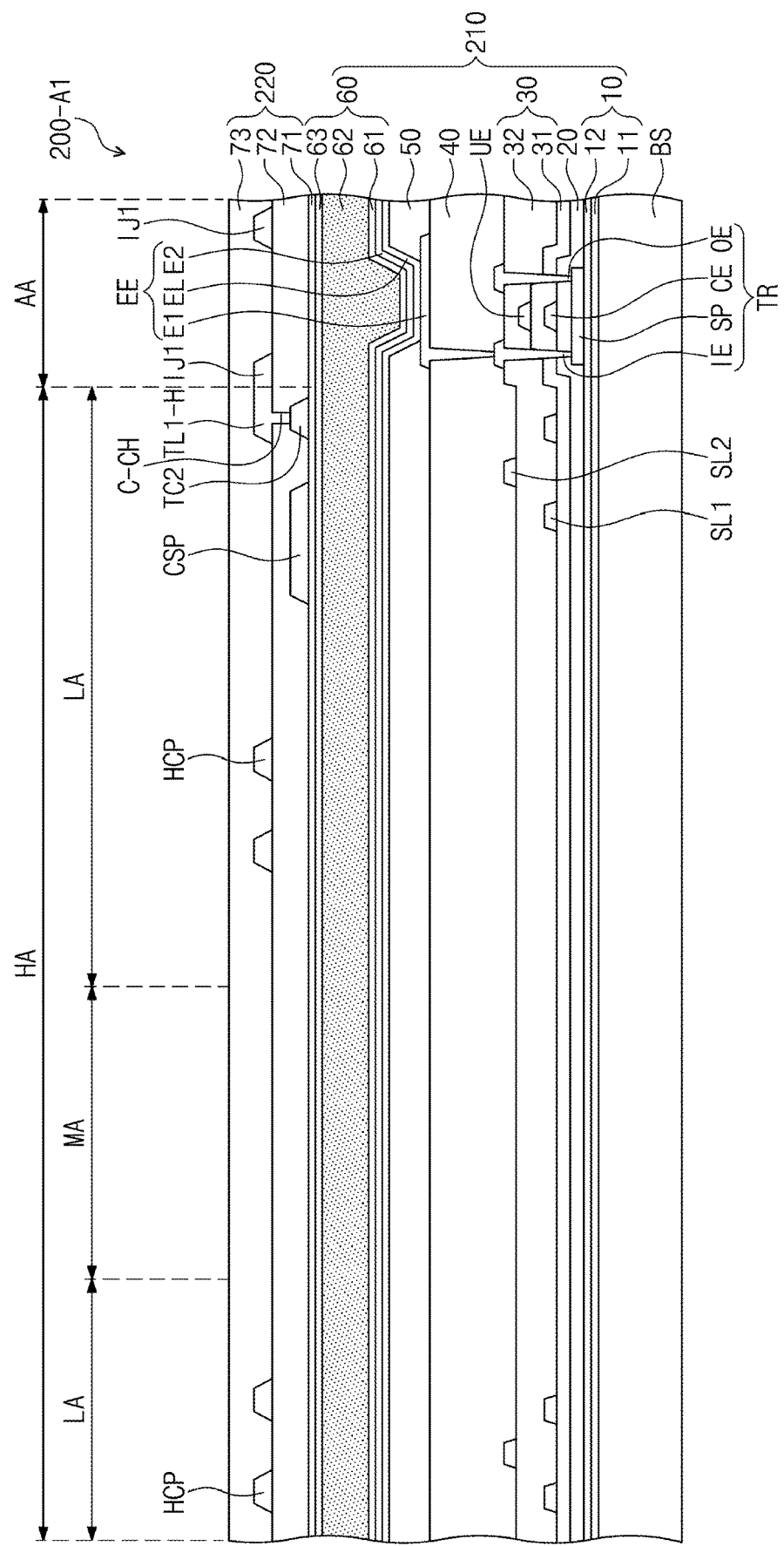
FIG. 7C is a cross-sectional view illustrating a partial area of an electronic panel according to an exemplary embodiment of the inventive concept.

FIG. 7A is a plan view of an electronic device according to an exemplary embodiment of the inventive concept. FIG. 7B is an enlarged view of area YY' shown in FIG. 7A. FIG. 7C is a cross-sectional view of a portion of an electronic panel according to an exemplary embodiment of the inventive concept. The same components as those described with reference to FIGS. 1 to 6 are given by the same reference numerals and redundant description will be omitted.

Referring to FIG. 7A, an electronic device EA-A according to an exemplary embodiment of the inventive concept may omit the module hole MH (see FIG. 2) that physically penetrates the electronic panel 200-A. The hole area HA may include a module area MA and a wiring area LA.

The wiring area LA can be defined along the edge of the module area MA. The wiring area LA may surround the edge of the module area MA. The hole area HA may correspond to an area including the module area MA and the wiring area LA.

The module area MA may be a space in which an external signal inputted to the electronic module 400 or a signal outputted from the electronic module 400 is transmitted.

The module area MA may be an area having a relatively high transmittance as compared with an area in which the pixels PX are disposed in the active area AA. The electronic module 400 may detect an external object through the module area MA or may easily provide the outputted optical signal to the outside.

In this exemplary embodiment, the module area MA may have a shape corresponding to the module holes MH described above. For example, the module area MA may have any shape of a circle, an ellipse, a polygon, or a polygon including curved sides on at least one side on a plane, and is not limited to any one specific embodiment.

At least one non-light emitting pixel NPX may be disposed in the module area MA according to the present exemplary embodiment. FIG. 7B shows two non-light emitting pixels NPX and two pixels PX for ease of explanation. The non-light emitting pixel NPX may have a higher light transmittance than the pixel PX. The non-light emitting pixel NPX may be formed by removing at least a portion of the configuration of the pixel PX.

For example, the non-light emitting pixel NPX may be formed by removing the thin film transistor TR from the pixel PX. Alternatively, the non-light emitting pixel NPX may be formed by removing the light emitting layer EL in the configuration of the pixel PX, or by removing a partial configuration of the thin film transistors TR or by removing only the first electrode E1. Alternatively, the non-light emitting pixel NPX may be formed by removing all the components of the pixel PX. At this time, the non-light emitting pixel NPX may be defined as a portion in which a plurality of insulating layers are stacked.

The non-light emitting pixel NPX according to an embodiment of the inventive concept may include various embodiments as long as it has a higher transmittance than the pixel PX. Also, if the module area MA can have a relatively high transmittance relative to its surroundings, it may be composed of a plurality of pixels PX and one non-light emitting pixel NPX, or it may be filled with only a plurality of non-light emitting pixels NPX, but is not limited to any one embodiment.

For example, as shown in FIG. 7B, the module area MA may be formed by removing the thin film transistor TR and the first electrode E1 of the pixel PX. In the module area MA, the insulating layers may be formed as continuously extending.

The base substrate BS, the first to fifth insulating layers 10, 20, 30, 40, and 50, the light emitting layer EL, the sealing layer 60, and the detection insulating layers 71, 72, and 73 can overlap the module area MA without being disconnected in the hole area HA. The base substrate BS, the first to fifth insulating layers 10, 20, 30, 40, and 50, the light emitting layer EL, the sealing layer 60, and the detection insulating layers 71, 72, and 73 may be entirely formed in the active area AA.

In the present exemplary embodiment, the second electrode E2 may be formed overlapping the module area MA. When the second electrode E2 is formed of a transmissive or semi-transmissive electrode, even if the second electrode E2 overlaps the module area MA, the module area MA having a relatively high transmittance can be formed as compared with the area where the pixels PX are arranged.

The crack detection pattern HCP may be disposed in the wiring area LA and may surround the edge of the module area MA on a plane. The crack detection pattern HCP is disposed along the edge of the module area MA, thereby preventing a decrease in transmittance of the module area MA.

However, the inventive concept is not limited thereto, and the second electrode E2 may be removed from the module region MA.

According to the inventive concept, a sign input/output between an electronic module that does not require high transmittance through the module area MA formed by removing the transparent structures, for example, an electronic module using infrared rays, may be easily performed. Even if the electronic module 400 is disposed overlapping the electronic panel 200-A, signal input/output with the outside can be stably performed. In addition, in relation to the electronic panel 200-A, the upper part of the electronic module 400 is covered by the electronic panel 200-A, so that the electronic module 400 can be stably protected from external shocks or contamination inflows.

Figure 8:
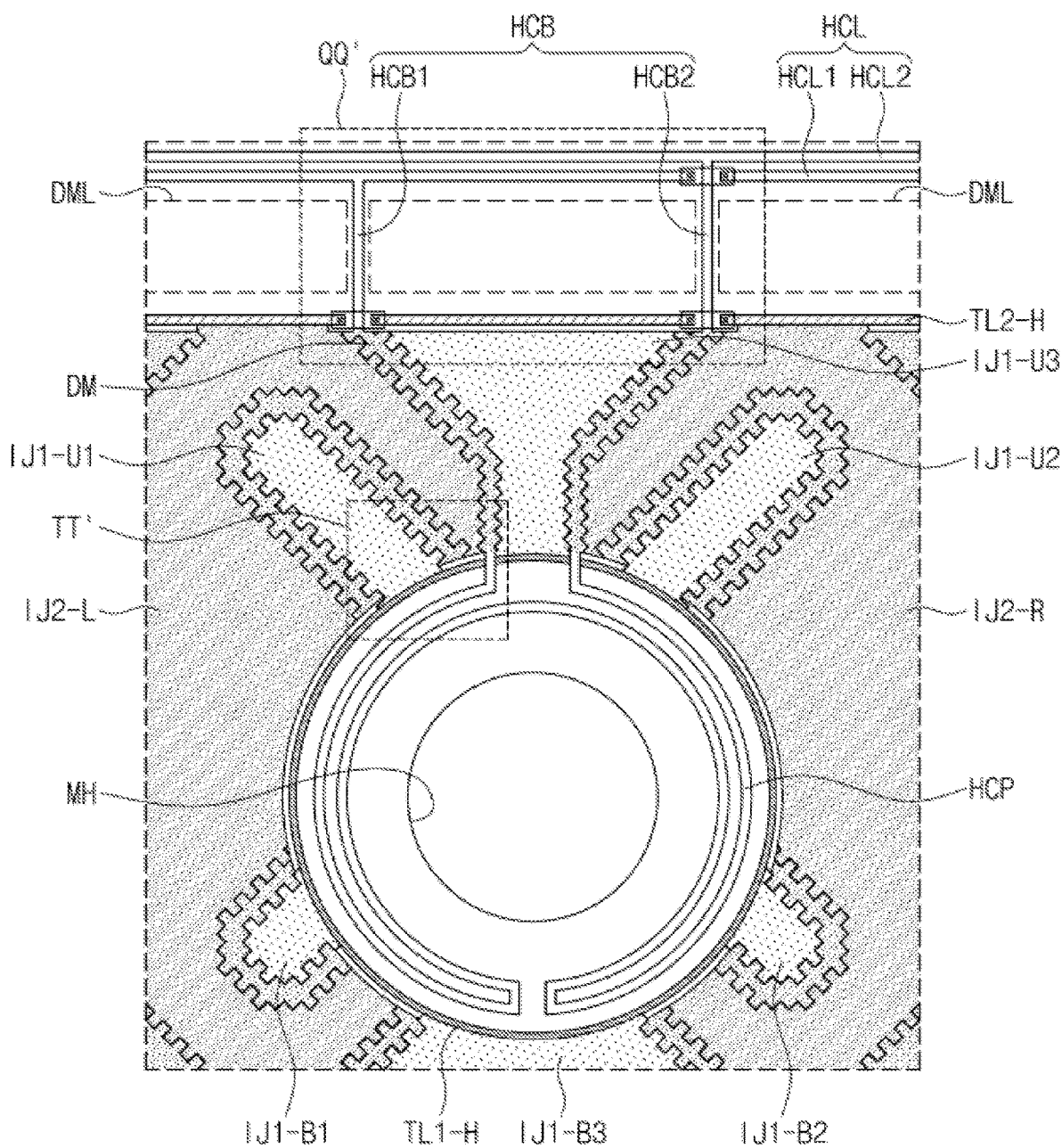
FIG. 8 is an enlarged view of a sensing unit adjacent to a hole area according to an exemplary embodiment of the inventive concept.

FIG. 8 is an enlarged view of a sensing unit adjacent to a hole area according to an exemplary embodiment of the inventive concept.

According to the inventive concept, the sensing unit 220 may include a hole pattern TL1-H connecting the first neighboring patterns IJ1-U1, IJ1-U2, IJ1-U3, IJ1-B1, IJ1-B2, and IJ1-B3 and a routing pattern TL2-H connecting the second neighboring patterns IJ2-L and IJ2-R.

The hole patterns TL1-H may be spaced apart from the module hole MH with the crack detection pattern HCP interposed therebetween. During the formation of the module holes MH, the hole pattern TL1-H may connect the first neighboring patterns IJ1-U1, IJ1-U2, IJ1-U3, IJ1-B1, IJ1-B2, and IJ1-B3 where the first main pattern MP (see FIG. 5B) is partially removed. According to the present exemplary embodiment, the hole patterns TL1-H may have a shape surrounding at least a portion of the module hole MH. The first neighboring patterns IJ1-U1, IJ1-U3, IJ1-B1, IJ1-B2, and IJ1-B3 may have different areas.

The routing pattern TL2-H may be disposed in the peripheral area NAA. The routing pattern TL2-H may be spaced apart from the crack detection line HCL. During the formation of the module holes MH, the routing pattern TL2-H may connect the second neighboring patterns IJ2-L and IJ2-R where the first main pattern MP (see FIG. 5B) is partially removed.

According to the inventive concept, because the routing pattern TL2-H is disposed in the peripheral area NAA, and the hole pattern TL1-H is disposed in the hole area HA surrounded by the active area AA, electrical interference between neighboring patterns receiving different signals can be minimized. For example, when the routing pattern TL2-H connecting the second neighboring patterns IJ2-L and IJ2-R is disposed in the hole area HA, a parasitic capacitance may occur between the routing pattern TL2-H and the first neighboring patterns IJ1-U1, IJ1-U2, IJ1-B2, and IJ1-B3.

According to the inventive concept, because the hole patterns for connecting neighboring patterns included in each of the first sensing electrode TE1 and the second sensing electrode TE2 are disposed in different areas, parasitic capacitance generation between the routing pattern TL2-H and the first neighboring patterns IJ1-U1, IJ1-U2, IJ1-U3, IJ1-B1, IJ1-B2, and IJ1-B3 and parasitic capacitance generation between hole pattern TL1-H and second neighboring patterns IJ2-L, IJ2-R can be minimized.

According to the inventive concept, the sensing unit 220 may further include routing dummy patterns DML disposed in the peripheral area NAA. The routing dummy patterns DML may be disposed between the crack detection line HCL and the routing pattern TL2-H. In addition to the routing patterns TL2-H, the routing dummy patterns DML may be included in the second conductive layer of the inventive concept. The shape of the routing dummy patterns DML may be similar to that of the crack detection line HCL. If the routing dummy patterns DML are a floating structure, the number and shape of the routing dummy patterns DML are not limited thereto.

According to the present exemplary embodiment, a part of the connection line HCB extending from the crack detection line HCL may cross between the routing dummy patterns DML. For example, the first connection line HCB1 extending from the first line HCL1 and the second connection line HCB2 extending from the second line HCL2 may pass between the routing dummy patterns DML and may be connected to the crack detection pattern HCP.

Figure 9:
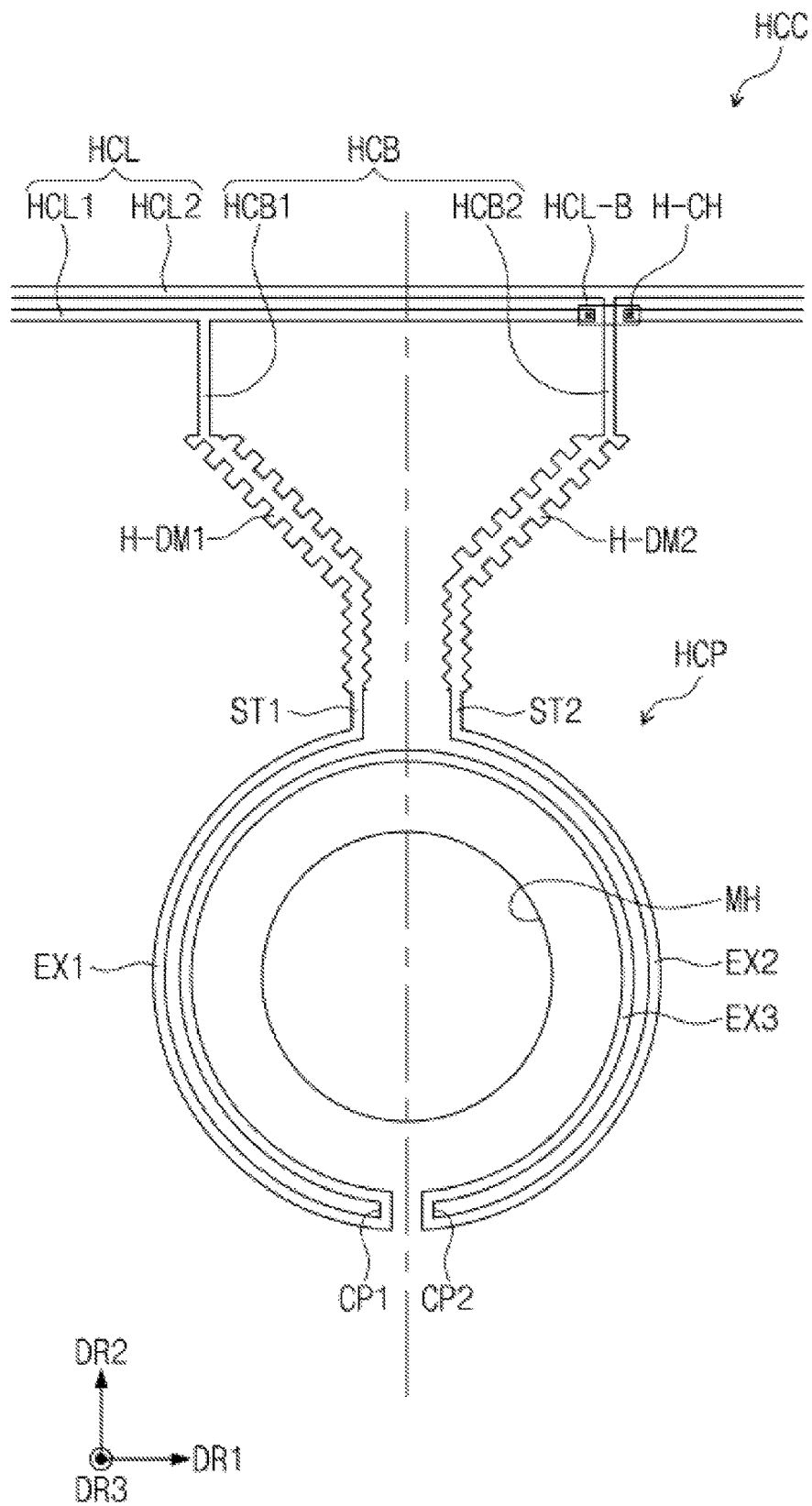
FIG. 9 is a plan view illustrating a crack detection circuit according to an exemplary embodiment of the inventive concept.

FIG. 9 is a plan view illustrating a crack detection circuit according to an exemplary embodiment of the inventive concept.

Referring to FIG. 9, the crack detection circuit HCC according to the present exemplary embodiment may include a crack detection pattern HCP, a crack detection line HCL, and a connection line HCB connected to each other.

The crack detection line HCL includes a first line HCL1 and a second line HCL2. The first line HCL1 may include a crack connection pattern HCL-B.

The first line HCL1 and the second line HCL2 may be disposed on the second detection insulating layer 72 (see FIG. 6). The crack connection pattern HCL-B may be disposed on the first detection insulating layer 71 (see FIG. 6).

Therefore, the point where the first line HCL1 overlaps the second line HCL2 may be connected through the crack connection pattern HCL-B. For example, a point where the second line HCL2 overlaps the first line HCL1 is disconnected. The crack connection pattern HCL-B may be connected to the disconnected one end and other end of the first line HCL1 through the crack contact hole H-CH defined in the second detection insulating layer 72.

The connection line HCB may include a first connection line HCB1 extending from the first line HCL1 and a second connection line HCB2 extending from the second line HCL2.

A portion of the connection lines HCB may be formed with a portion of the dummy patterns DM. For example, the first dummy line H-DM1 disposed between the first connection line HCB1 and the crack detection pattern HCP may constitute a part of the first connection line HCB1. The second dummy line H-DM2 disposed between the second connection line HCB2 and the crack detection pattern HCP may constitute a part of the second connection line HCB2.

The crack detection pattern HCP may include a first extension part EX1, a second extension part EX2, a third extension part EX3, a first connection part CP1, a second connection part CP2, a first protruding part ST1, and a second protruding part ST2. The first extension part EX1, the second extension part EX2, the third extension part EX3, the first connection part CP1, the second connection part CP2, the first protruding part ST1, and the second protruding part ST2 may be connected to each other to form an integral shape.

The first extension part EX1 and the second extension part EX2 face each other with respect to the virtual line. The first extension part EX1 and the second extension part EX2 are disposed in the hole area HA, and extend along the edge of the hole area HA. The first extension part EX1 to the third extension part EX3 may be substantially disposed in the wiring area LA.

The first extension part EX1 is disposed at the left side of the virtual line and the second extension part EX2 is disposed at the right side of the virtual line. The first extension part EX1 may have a semicircular shape convex to the left side, and the second extension part EX2 may have a semicircular shape convex to the right side. The first extension part EX1 and the second extension part EX2 may be linearly symmetric with respect to the virtual line.

The third extension part EX3 may be spaced apart from the first extension part EX1 and the second extension part EX2. The third extension part EX3 may be disposed closer to the module hole MH than the first extension part EX1 and the second extension part EX2. The third extension part EX3 is disposed in the hole area HA and extends along the edge of the hole area HA. The first connection part CP1 connects one end of the first extension part EX1 and one end of the third extension part EX3.

The first connection part CP1 connects one end of the first extension part EX1 and one end of the third extension part EX3. The second connection part CP2 is spaced apart from the first connection part CP1 to connect one end of the second extension part EX2 and the other end of the third extension part EX3.

The first connection part CP1 and the second connection part CP2 may face each other with a virtual line therebetween. Each of the first connection part CP1 and the second connection part CP2 may extend along a direction parallel to the extension direction of the virtual line. In the present embodiment, each of the first connection part CP1 and the second connection part CP2 may be parallel to the virtual line. The first connection part CP1 and the second connection part CP2 may be linearly symmetric with respect to the virtual line.

The first protruding part ST1 is connected to the other end of the first extension part EX1 and the first dummy line H-DM1. The second protruding part ST2 is connected to the other end of the second extension part EX2 and the second dummy line H-DM2. The first protruding part ST1 and the second protruding part ST2 may be line symmetrical with respect to the virtual line.

However, this is merely an example, and in the crack detection circuit HCC according to the inventive concept, at least one of the protruding parts ST1 and ST2 may be omitted. In this case, the first connection line HCB1 or the second connection line HCB2 may be directly connected to the first extension part EX1 or the second extension part EX2, but is not limited to any one specific embodiment.

Figure 10A:
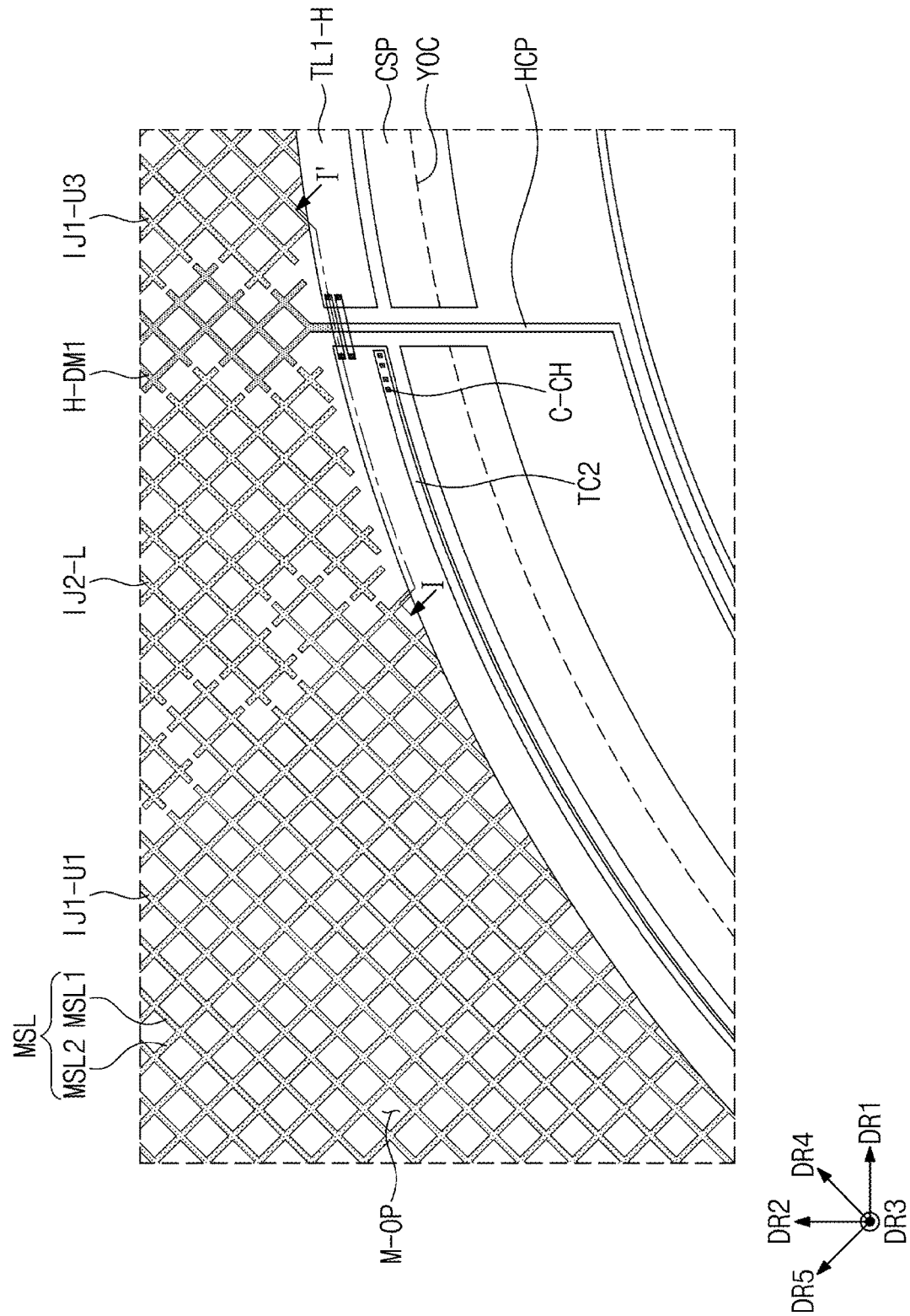
FIG. 10A is an enlarged plan view of area TT' shown in FIG. 8.
Figure 10B:
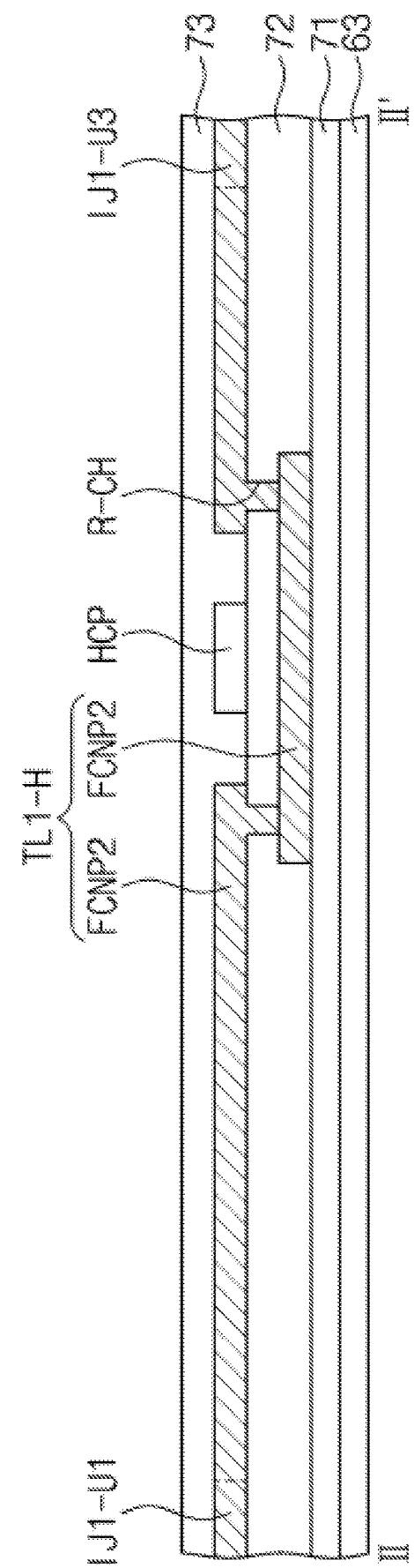
FIG. 10B is a cross-sectional view taken along line I-I' shown in FIG. 10A.

FIG. 10A is an enlarged plan view of area TT' shown in FIG. 8. FIG. 10B is a cross-sectional view taken along line I-I' shown in FIG. 10A. For convenience of description, the planarization layer YOC (see FIG. 6) is shown in dotted lines.

The sensing electrodes TE1 and TE2 (see FIG. 5A) according to the inventive concept may include mesh lines MSL1 and MLS2 extending in a fourth direction DR4 and a fifth direction DR5. The mesh lines MSL1 and MLS2 define a mesh opening part M-OP. Components included in the sensing electrodes TE1 and TE2 described below are described as a structure including the mesh lines MSL1 and MLS2.

In the present exemplary embodiment, the first neighboring patterns IJ1-U1 and IJ1-U3, the second neighboring patterns IJ2-L, the first dummy line H-DM1, the hole pattern TL1-H, and the crack detection pattern HCP may be included in the second conductive layer. In addition, the connection pattern TR1 connecting the additional hole pattern TC2, the antistatic pattern CSP, and the spaced apart hole pattern TL1-H may be included in the first conductive layer.

Referring to FIGS. 10A and 10B, the hole pattern TL1-H according to the inventive concept may be connected to the first neighboring patterns IJ1-U1 and IJ1-U3. The hole patterns TL1-H may be spaced apart from the second neighboring pattern IJ2-L and the first dummy line H-DM1.

Because the hole pattern TL1-H and the crack detection pattern HCP are included on the second conductive layer of the inventive concept, electrical interference may occur at the points of intersection. Accordingly, at the point where the hole pattern TL1-H and the crack detection pattern HCP intersect each other, the hole patterns TL1-H may include a connection pattern TR1 disposed on the first detection insulating layer 71 and an extension pattern TR2 disposed on the second detection insulating layer 72. The extension pattern TR2 and the connection pattern TR1 may be connected through a contact hole R-CH defined in the second detection insulating layer 72. Therefore, the hole pattern TL1-H and the crack detection pattern HCP included in the second conductive layer of the inventive concept can transmit/receive different signals without electric interference.

In addition, the first neighboring pattern IJ1-U1 may be connected to one end of the extension pattern TR2, and the other end of the extension pattern TR2 may be connected to the first neighboring pattern IJ1-U3 receiving the same signal.

FIG. 10A illustrates a hole pattern TL1-H connected to two first neighboring patterns IJ1-U1 and IJ1-U3 by way of example, but the inventive concept is not limited to this. The first neighboring patterns disposed around the hole area HA and receiving the same signal as the first neighboring patterns IJ1-U1 and IJ1-U3 may be connected to the hole patterns TL1-H.

According to the present exemplary embodiment, an additional hole pattern TC2 whose at least portion overlaps the hole pattern TL1-H and which is disposed on a layer different from that the hole pattern TL1-H may be further included. The hole patterns TL1-H may be disposed on the second detection insulating layer 72 (see FIG. 6), and the additional hole pattern TC2 may be disposed on the first detection insulating layer 71 (see FIG. 6). The additional hole pattern TC2 may be connected to the hole patterns TL1-H through the hole contact hole C-CH defined in the first detection insulating layer 71.

According to the present exemplary embodiment, an antistatic pattern CSP disposed between the crack detection pattern HCP and the hole patterns TL1-H may be further included. An antistatic pattern CSP may be disposed on the first detection insulating layer 71. The antistatic pattern CSP may prevent static electricity flowing from the outside along the first dummy line H-DM1 from flowing into the hole area HA.

Figure 11A:
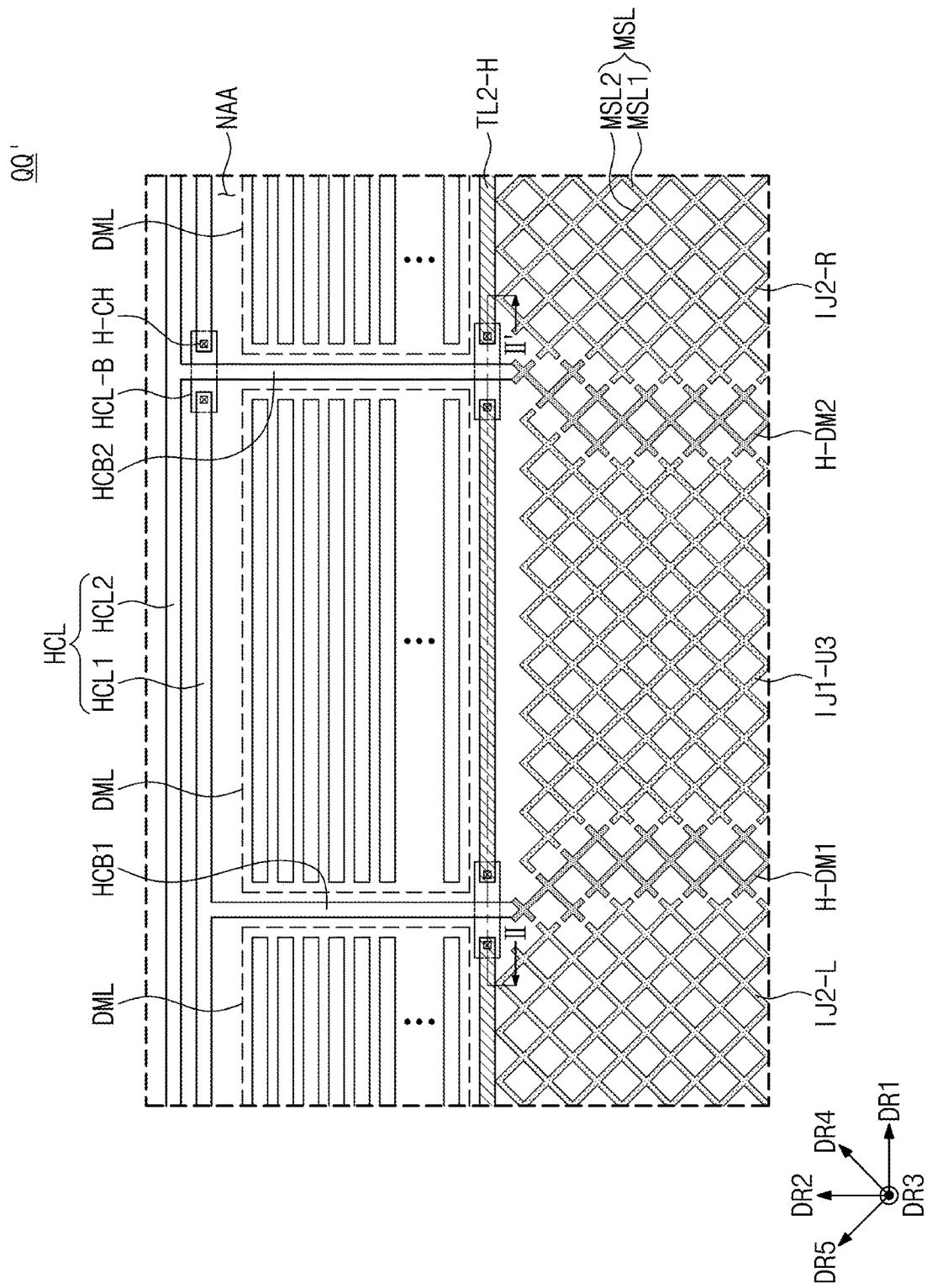
FIG. 11A is an enlarged plan view of area QQ' shown in FIG. 8.
Figure 11B:
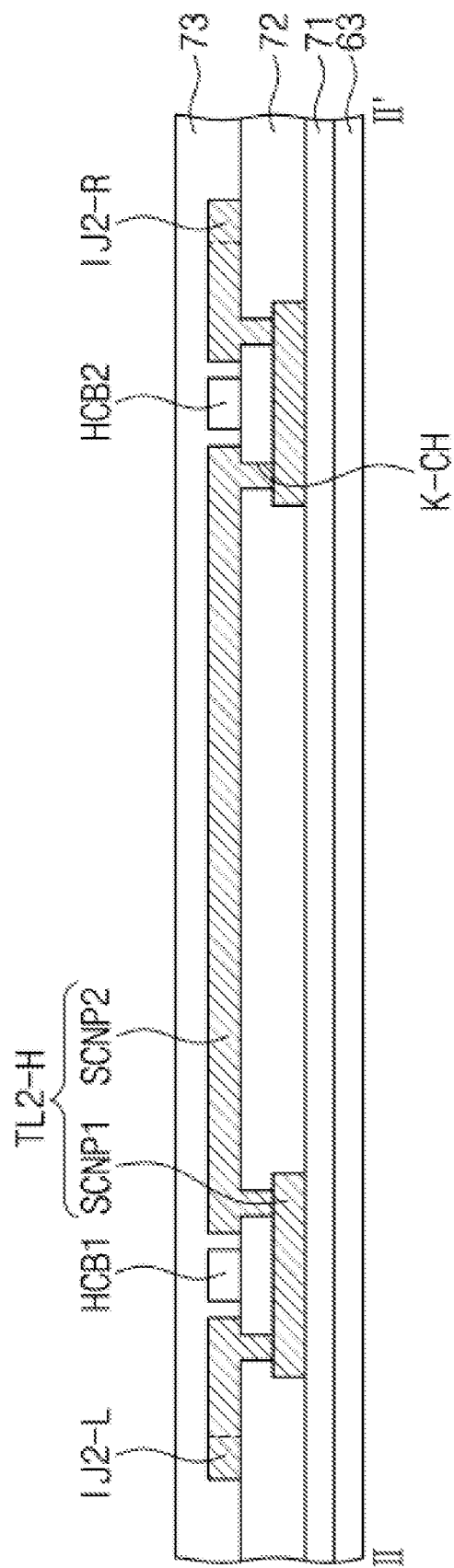
FIG. 11B is a cross-sectional view taken along line II-II' shown in FIG. 11A.

FIG. 11A is an enlarged plan view of area QQ' shown in FIG. 8. FIG. 11B is a cross-sectional view taken along line shown in FIG. 11A.

In the present exemplary embodiment, the first neighboring patterns IJ1-U3, the second neighboring patterns IJ2-L and IJ2-R, the dummy lines H-DM1 and H-DM2, the routing pattern TL2-H, the crack detection line HCL, the connection line HCB, and the routing dummy patterns DML may be included in the second conductive layer. In addition, a portion of the routing pattern TL2-H overlapping the crack connection pattern HCL-B and the connection line HCB may be included in the first conductive layer.

Referring to FIGS. 11A and 11B, the routing pattern TL2-H according to the inventive concept may be connected to the second neighboring patterns IJ2-L and IJ2-R. The routing pattern TL2-H may be spaced apart from the first neighboring patterns IJ1-U3 and the dummy lines H-DM1 and H-DM2.

Because the routing pattern TL2-H and the connection line HCB are included on the second conductive layer of the inventive concept, electrical interference may occur at the points of intersection. Accordingly, at the point where the routing pattern TL2-H and the connection line HCB intersect each other, the routing pattern TL2-H may include connection patterns TL1 disposed on the first detection insulating layer 71 and extension patterns TL2 disposed on the second detection insulating layer 72. The extension patterns TL2 and the connection patterns TL1 may be connected through a contact hole K-CH defined in the second detection insulating layer 72. Therefore, the routing pattern TL2-H and the connection line HCB included in the second conductive layer of the inventive concept can transmit/receive different signals without electric interference.

In addition, one end of one of the extension patterns TL2 may be connected to the second neighboring pattern IJ2-L, and the other end of the extension patterns TL2 may be connected to one end of a second neighboring pattern IJ2-R receiving the same signal.

In the present exemplary embodiment, the routing pattern TL2-H may extend in the same direction as the first direction DR1, which is a direction in which the second neighboring patterns IJ2-L and IJ2-R are arranged.

Figure 12:
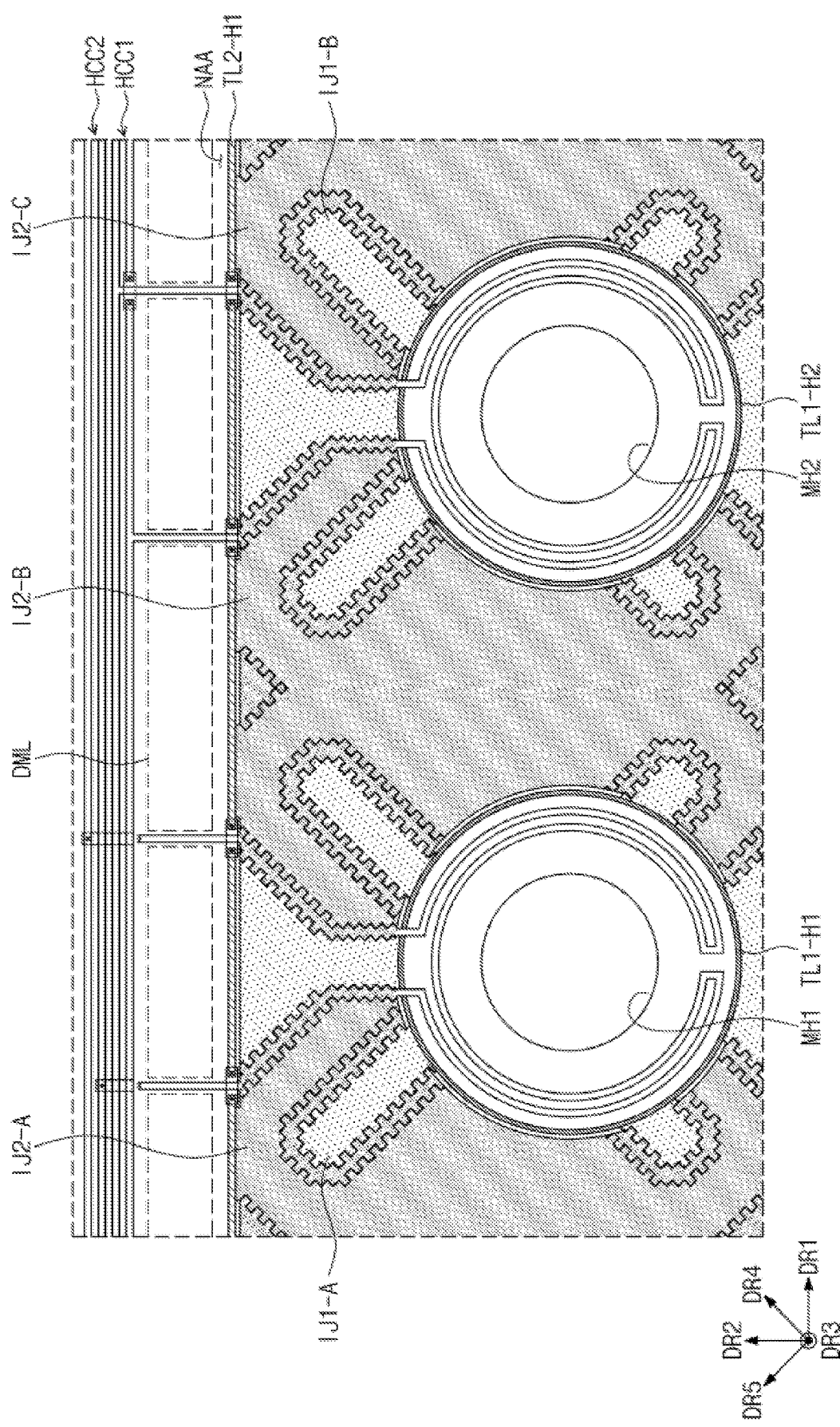
FIG. 12 is an enlarged view of a sensing unit adjacent to a hole area according to an exemplary embodiment of the inventive concept.

FIG. 12 is an enlarged view of a sensing unit adjacent to a hole area according to an exemplary embodiment of the inventive concept. The like reference numerals refer to like elements throughout FIGS. 1 to 11B, and redundant descriptions are omitted.

Although not shown in the drawings, the electronic device EA (see FIG. 2) may include a plurality of electronic modules 400 (see FIG. 2). Referring to FIG. 12, the electronic panel 200 (see FIG. 2) may include a plurality of module holes MH1 and MH2 overlapping the electronic modules 400. The plurality of electronic modules may include at least one of the above-described electronic modules EM1 and EM2 (see FIG. 3).

The plurality of module holes MH2 and MH2 may be formed in the active area AA. The module holes MH2 and MH2 may include a first module hole MH1 and a second module hole MH2. The first module hole MH1 and the second module hole MH2 are defined as being spaced apart from each other in the first direction DR1.

According to this exemplary embodiment, in the process of forming the module holes MH1 and MH2, it may include crack detection circuits HCC1 and HCC2 for detecting whether a crack occurs in an area adjacent to the module holes MH1 and MH2. Components included in each of the crack detection circuits HCC1 and HCC2 may include the same components as the crack detection circuit HCC described with reference to FIG. 9.

The first crack detection circuit HCC1 may detect whether a crack occurs near the first module hole MH1, and the second crack detection circuit HCC2 may detect whether a crack occurs near the second module hole MH2.

According to the inventive concept, when the plurality of module holes MH1 and MH2 are formed, the hole patterns TL1-H1, which connect each of the first neighboring patterns IJ1-A and IJ1-B having a shape with a removed portion, are formed. For example, the first hole patterns TL1-H1 may connect the first neighboring patterns IJ1-A, which are partially removed when the first module hole MH1 is formed. The second hole patterns TL1-H2 may connect the first neighboring patterns IJ1-B receiving a signal different from that of the first neighboring patterns IJ1-A, which are partially removed when the second module hole MH2 is formed.

Further, according to the inventive concept, when forming a plurality of module holes MH1 and MH2, a routing pattern TL2-H1 connecting the second neighboring patterns IJ2-A, IJ2-B, and IJ2-C having a removed portion is included.

According to the present exemplary embodiment, a plurality of module holes MH1 and MH2 overlapping with the electronic modules are provided. As a result, even if neighboring patterns having a shape whose portion is cut are included, by connecting the corresponding neighboring patterns and including routing patterns and hole patterns arranged in different areas, the sensing unit 220 (see FIG. 2) may be provided to reduce a parasitic capacitance between patterns receiving different signals.

Figure 13:
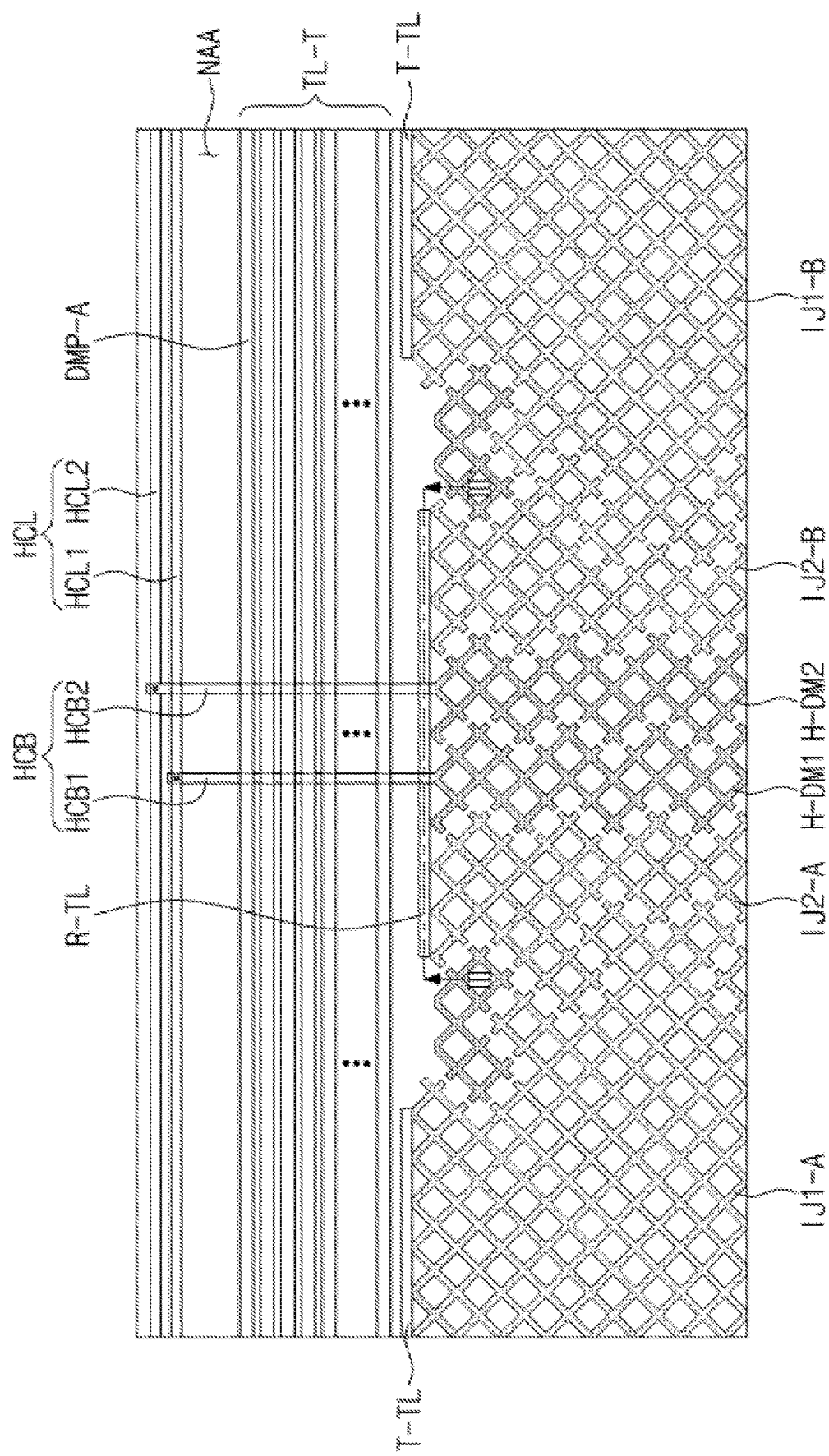
FIG. 13 is an enlarged view of a portion of a sensing unit according to an exemplary embodiment of the inventive concept.
Figure 14:
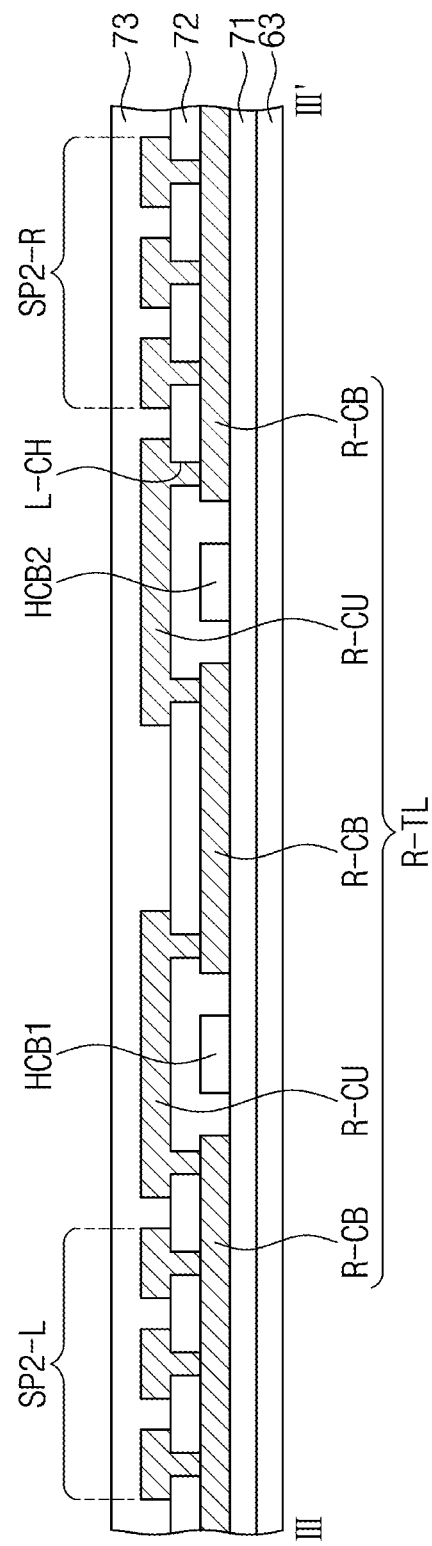
FIG. 14 is a cross-sectional view taken along line shown in FIG. 13.

FIG. 13 is an enlarged view of a portion of a sensing unit according to an exemplary embodiment of the inventive concept. FIG. 14 is a cross-sectional view taken along line shown in FIG. 13. The like reference numerals refer to like elements throughout FIGS. 1 to 11B, and redundant descriptions are omitted.

Referring to FIG. 13, detection lines TL-T overlapping a connection line HCB may be disposed in the peripheral area NAA according to the inventive concept. In relation to the detection lines TL-T, some of the first detection lines TL1 of the detection lines TL1 and TL2 described above with reference to FIG. 5A may be connected to one ends of the first sensing electrodes TE1, and some of the remaining of the first detection lines TL1 may be connected to the other ends of the first sensing electrodes TEL In this case, the detection lines TL-T connected to the other ends of the first sensing electrodes TE1 among the first detection lines TL1 may overlap the connection line HCB.

In this exemplary embodiment, a crack detection line HCL, detection lines TL-T, first neighboring patterns IJ1-A and IJ1-B, a first connection part T-TL, and second neighboring patterns IJ2-A and IJ2-B, and dummy lines H-DM1 and H-DM2 may be included in a second conductive layer of the inventive concept. In addition, the connection line HCB and the second connection part R-TL may be included in the first conductive layer.

According to the present exemplary embodiment, the first neighboring patterns IJ1-A and IJ1-B may be connected to the detection lines TL-T through the first connection part T-TL. The first connection part T-TL may be spaced apart from the second neighboring patterns IJ2-A and IJ2-B. The second neighboring patterns IJ2-A and IJ2-B may transmit/receive signals between spaced second neighboring patterns IJ2-A and IJ2-B through a second connection part R-TL included in the first conductive layer Referring to FIG. 14, in relation to the connection line HCB included in the first conductive layer and the second connection part R-TL, the second connection part R-TL includes a lower part R-CB and an upper part R-CU in an area overlapping the connection line HCB in order to avoid electrical interference. The lower part R-CB and the upper part R-CU may be connected to each other through a contact hole L-CH defined in the second detection insulating layer 72, and may be electrically insulated from the connection line HCB through the second detection insulating layer 72.

According to the inventive concept, as the patterns connecting the detection patterns whose portion is cut are disposed in different areas, the parasitic capacitance may be minimized. Accordingly, it is possible to provide an electronic device with improved reliability.

Although certain exemplary embodiments have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. An electronic device comprising:
   an electronic module; and
   a sensing unit detecting an external input, the sensing unit being divided into a hole area overlapping the electronic module, an active area surrounding the hole area, and a peripheral area adjacent to the active area and including a first sensing electrode and a second sensing electrode disposed in the active area and spaced apart from each other,
   wherein:
   the first sensing electrode comprises first main patterns, first neighboring patterns having a shape different from a shape of the first main patterns, and a hole pattern connected to the adjacent first neighboring patterns;
   the second sensing electrode comprises second main patterns, second neighboring patterns adjacent the hole area and having a shape different from a shape of the second main patterns, second connection patterns connected to the second main patterns, and a routing pattern connected to the adjacent second neighboring patterns; and
   the hole pattern is disposed in the hole area, and the routing pattern is disposed in the peripheral area.

2. The electronic device of claim 1, wherein:
   the first peripheral patterns have areas smaller than areas of the first main patterns; and
   the second peripheral patterns have areas smaller than areas of the second main patterns.

3. The electronic device of claim 1, wherein the hole pattern extends along the boundary of the hole area and the active area.

4. The electronic device of claim 1, wherein the routing pattern extends along the boundary of the active area and the peripheral area.

5. The electronic device of claim 1, wherein the routing pattern extends in the same direction as the direction in which the second neighboring patterns are arranged.

6. The electronic device of claim 1, wherein:
   the sensing unit is defined by a first detection insulating layer, a first conductive layer disposed on the first detection insulating layer, a second detection insulating layer covering the first conductive layer and having a plurality of defined first contact holes overlapping the active area, and a second conductive layer disposed on the second detection insulating layer;
   the second connection patterns are comprised in the first conductive layer;
   the first main patterns, the first neighboring patterns, the second main patterns, and the second neighboring patterns are comprised in the second conductive layer; and
   the second connection patterns are connected to the second main patterns through the first contact holes.

7. The electronic device of claim 6, wherein the routing pattern is disposed on the same layer as the first neighboring patterns.

8. The electronic device of claim 6, the hole pattern is disposed on the same layer as the second neighboring patterns.

9. The electronic device of claim 1, wherein the electronic device further comprises a crack detection circuit comprising:
   a crack detection line disposed in the peripheral area;
   a crack detection pattern disposed in the hole area; and
   a connection line connecting the crack detection line and the crack detection pattern.

10. The electronic device of claim 9, wherein the electronic device further comprises an antistatic pattern disposed in the hole area and disposed between the crack detection pattern and the hole pattern.

11. The electronic device of claim 9, wherein the hole pattern surrounds at least a portion of the crack detection pattern.

12. The electronic device of claim 1, wherein each of the first sensing electrode and the second sensing electrode comprises mesh lines defining mesh opening parts.

13. The electronic device of claim 12, wherein:
   each of the second main patterns comprises a center pattern extending in one direction and branch patterns connected to the center pattern and extending in diagonal directions of the one direction; and
   each of the first main patterns surrounds a portion of the center pattern of a corresponding second main pattern among the second main patterns and the branch patterns.

14. The electronic device of claim 1, wherein:
   the electronic device further comprises a display unit disposed under the sensing unit and including first electrodes, a second electrode facing the first electrodes, and light emitting layers disposed between the first electrodes and the second electrode; and
   each of the light emitting layers overlaps the corresponding mesh opening parts.

15. The electronic device of claim 14, the electronic device further comprises a module hole defined through at least a portion of the display unit and the sensing unit overlapping the hole area.

16. The electronic device of claim 15, wherein:
   the electronic module comprises a first electronic module and a second electronic module; and
   the module hole comprises a first module hole overlapping the first electronic module and a second module hole overlapping the second electronic module.

17. The electronic device of claim 16, wherein the electronic module comprises at least one of an image input module, an image output module, an optical detection module, and an optical output module.

\* \* \* \* \*

UNITED STATES PATENT AND TRADEMARK OFFICE
CERTIFICATE OF CORRECTION

| | | |
|---|---|---|
| PATENT NO. | : 11,907,457 B2 | Page 1 of 1 |
| APPLICATION NO. | : 17/994370 | |
| DATED | : February 20, 2024 | |
| INVENTOR(S) | : Wonjun Choi et al. | |

It is certified that error appears in the above-identified patent and that said Letters Patent is hereby corrected as shown below:

On the Title Page

Item [63], Line 2, delete "2019," and insert -- 2020, --.

Signed and Sealed this
Ninth Day of July, 2024

Katherine Kelly Vidal
*Director of the United States Patent and Trademark Office*